(12) United States Patent
So et al.

(10) Patent No.: US 9,646,706 B2
(45) Date of Patent: May 9, 2017

(54) STORAGE DEVICE AND OPERATING METHOD THEREOF

(71) Applicants:Hyejeong So, Seoul (KR); Junjin Kong, Yongin-si (KR); Changkyu Seol, Osan-si (KR); Hong Rak Son, Anyang-si (KR); Seonghyeog Choi, Hwaseong-si (KR)

(72) Inventors: Hyejeong So, Seoul (KR); Junjin Kong, Yongin-si (KR); Changkyu Seol, Osan-si (KR); Hong Rak Son, Anyang-si (KR); Seonghyeog Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/070,122

(22) Filed: Mar. 15, 2016

(65) Prior Publication Data

US 2016/0276035 A1    Sep. 22, 2016

(30) Foreign Application Priority Data

Mar. 16, 2015  (KR) ......................... 10-2015-0036173

(51) Int. Cl.
| | | |
|---|---|---|
| *G11C 16/06* | (2006.01) | |
| *G11C 16/26* | (2006.01) | |
| *G11C 16/10* | (2006.01) | |
| *G11C 29/52* | (2006.01) | |
| *H03M 13/27* | (2006.01) | |

(Continued)

(52) U.S. Cl.
CPC .......... *G11C 16/26* (2013.01); *G06F 11/1048* (2013.01); *G11C 16/0483* (2013.01); *G11C 16/10* (2013.01); *G11C 29/021* (2013.01); *G11C 29/028* (2013.01); *G11C 29/42* (2013.01); *G11C 29/52* (2013.01); *H03M 13/271* (2013.01); *H03M 13/2707* (2013.01); *H03M 13/2789* (2013.01); *H03M 13/2909* (2013.01); *H03M 13/6508* (2013.01); *G11C 7/1006* (2013.01)

(58) Field of Classification Search
CPC ..... G11C 16/26; G11C 16/0466; G11C 16/10; G11C 29/52; G06F 11/1068; H03M 13/2792; H03M 13/2906
See application file for complete search history.

(56) References Cited

U.S. PATENT DOCUMENTS

| | | |
|---|---|---|
| 7,679,133 B2 | 3/2010 | Son et al. |
| 7,793,191 B2 | 9/2010 | Takamura |

(Continued)

FOREIGN PATENT DOCUMENTS

| | | |
|---|---|---|
| KR | 1020090122063 A | 11/2009 |
| KR | 10-2012-0030816 A | 3/2012 |

*Primary Examiner* — Son Dinh
*Assistant Examiner* — Uyen B Tran
(74) *Attorney, Agent, or Firm* — Volentine & Whitt, PLLC

(57) ABSTRACT

An operating method is for a storage device that includes a nonvolatile memory and a memory controller configured to control the nonvolatile memory. The operating method may include the memory controller receiving a read request from an external device, the memory controller adjusting a read scheme according to target data indicated by the read request among data of one page of the nonvolatile memory, and the memory controller reading the target data from the nonvolatile memory according to the adjusted read scheme.

19 Claims, 23 Drawing Sheets

(51) Int. Cl.
*H03M 13/29* (2006.01)
*H03M 13/00* (2006.01)
*G06F 11/10* (2006.01)
*G11C 16/04* (2006.01)
*G11C 29/02* (2006.01)
*G11C 29/42* (2006.01)
*G11C 7/10* (2006.01)

(56) References Cited

U.S. PATENT DOCUMENTS

| | | |
|---|---|---|
| 8,301,978 B2 | 10/2012 | Seol et al. |
| 8,427,867 B2 | 4/2013 | Weingarten |
| 8,553,466 B2 | 10/2013 | Han et al. |
| 8,559,235 B2 | 10/2013 | Yoon et al. |
| 8,560,919 B2 | 10/2013 | D'Abreu et al. |
| 8,654,587 B2 | 2/2014 | Yoon et al. |
| 8,711,624 B2 | 4/2014 | Choi et al. |
| 2011/0233648 A1 | 9/2011 | Seol et al. |
| 2012/0066436 A1* | 3/2012 | Yang .................. G11C 11/5628 711/103 |
| 2012/0213004 A1* | 8/2012 | Yun ..................... G11C 11/5642 365/185.11 |
| 2013/0056820 A1* | 3/2013 | Jeong .................. H01L 27/0688 257/324 |
| 2013/0212315 A1 | 8/2013 | Steiner et al. |
| 2014/0164879 A1 | 6/2014 | Tam |
| 2015/0006983 A1* | 1/2015 | Lin .................. G11C 29/50004 714/721 |
| 2015/0085573 A1* | 3/2015 | Sharon ............... G06F 11/1048 365/185.03 |
| 2016/0170871 A1* | 6/2016 | Hyun .................. G06F 12/0653 711/103 |

* cited by examiner

FIG. 4
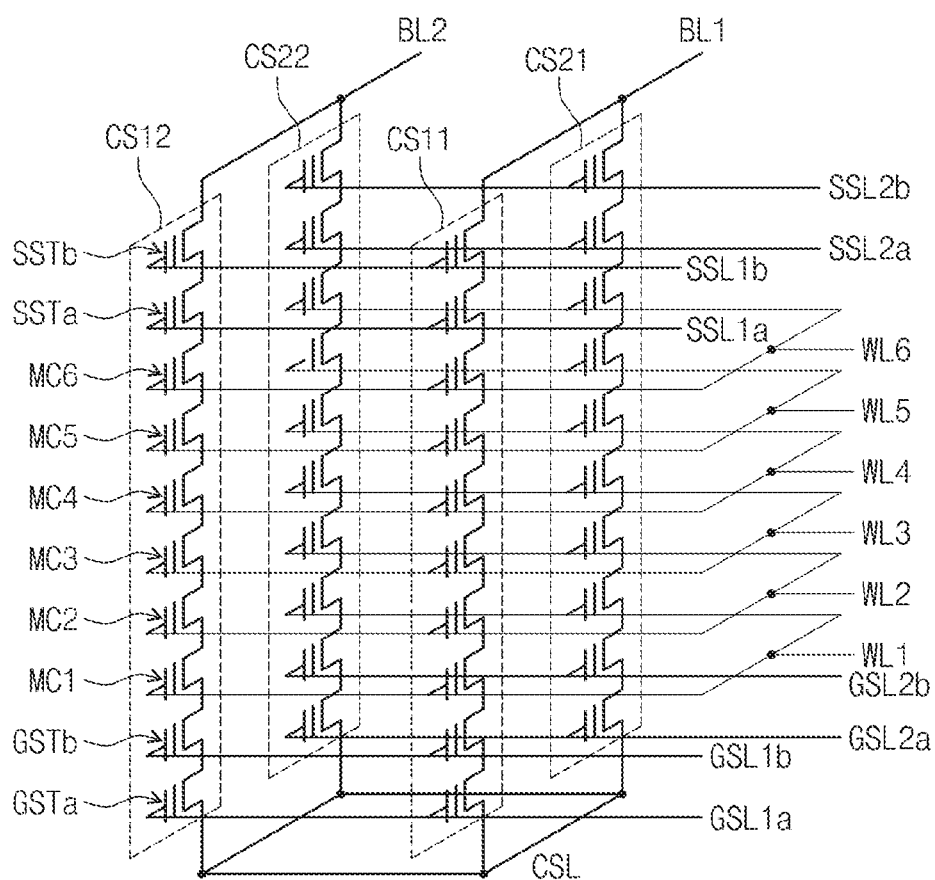
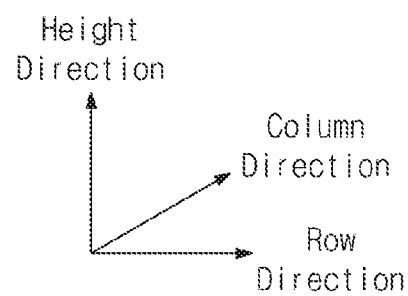

FIG. 8

| Unit of read | CW1 | CW2 | CW3 | CW4 |
|---|---|---|---|---|
| 1-codeword | VOFF1 | VOFF2 | VOFF3 | VOFF4 |
| 2-codeword | VOFF5 | | VOFF6 | |

FIG. 16
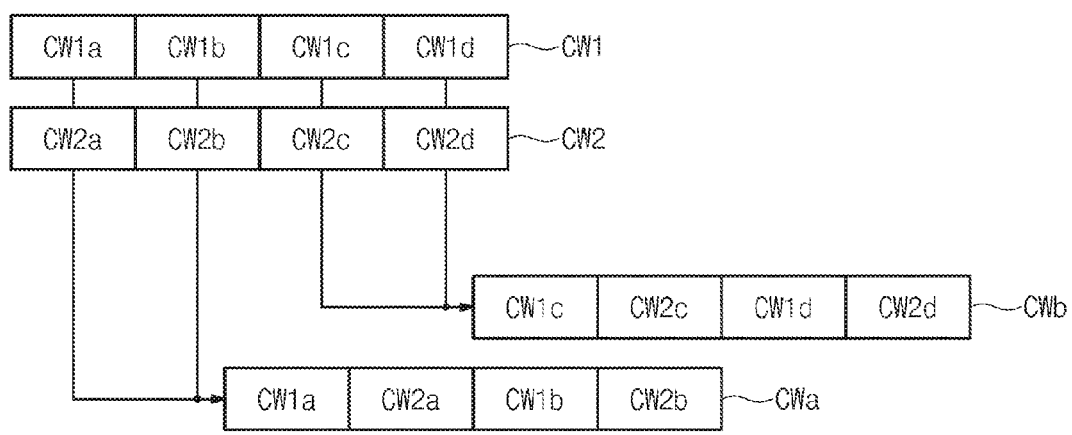
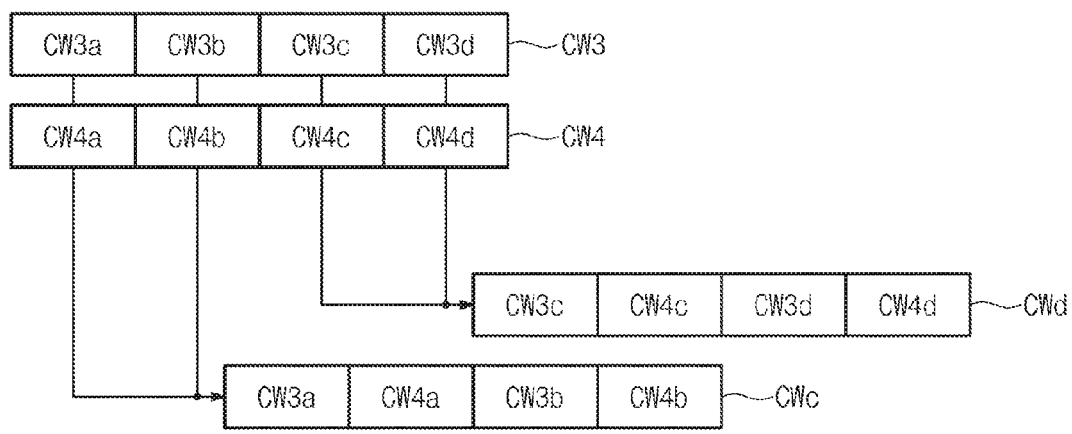

STORAGE DEVICE AND OPERATING METHOD THEREOF

CROSS-REFERENCE TO RELATED APPLICATIONS

This U.S. non-provisional patent application claims priority under 35 U.S.C. §119 of Korean Patent Application No. 10-2015-0036173, filed on Mar. 16, 2015, the entire contents of which are hereby incorporated by reference.

FIELD

The inventive concept relates to a semiconductor memory, and more particularly, to a storage device including a semiconductor memory and an operating method thereof.

BACKGROUND

A storage device is a device storing data under the control of a host device such as a computer, a smart phone, a smart pad, etc. A storage device may include a device storing data in a magnetic disk such as a HDD (hard disk drive) or a device storing data in a semiconductor memory, in particular, a nonvolatile memory such as an SSD (solid state drive), a memory card, etc.

Examples of a nonvolatile memory include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), a FRAM (ferroelectric RAM), etc.

As semiconductor manufacturing technology develops, high integration and a higher capacity of a nonvolatile memory or a storage device are continuously proceeding. A high integration of a nonvolatile memory or a storage device has an advantage of reducing its production cost. However, as a scale of a nonvolatile memory or a storage device is reduced and its structure is changed due to the high integration of the nonvolatile memory of the storage device, various problems that were not previously known are being found. The various problems being newly found may damage data stored in the nonvolatile memory or the storage device and thereby reliability of the nonvolatile memory or the storage device may be degraded. A requirement for a method and a device that can improve reliability of the nonvolatile memory or the storage device is continuously being suggested.

SUMMARY

Embodiments of the inventive concept provide an operating method of a storage device including a nonvolatile memory and a memory controller configured to control the nonvolatile memory. The operating method may include receiving, by the memory controller, a read request from an external device, adjusting, by the memory controller, a read scheme according to target data indicated by the read request among data of one page of the nonvolatile memory, and reading, by the memory controller, the target data from the nonvolatile memory according to the adjusted read scheme.

Embodiments of the inventive concept provide an operating method of a storage device including a nonvolatile memory and a memory controller configured to control the nonvolatile memory. The operating method may include receiving a read request from an external device, adjusting levels of read voltages according to target data indicated by the read request among data of one logical page of the nonvolatile memory, and reading the target data from the nonvolatile memory according to the adjusted levels of read voltages.

Embodiments of the inventive concept also provide a storage device. The storage device may include a nonvolatile memory, and a memory controller configured to control the nonvolatile memory. The memory controller is configured to adjust a read scheme according to target data which is a read target among data of one logical page of the nonvolatile memory.

In embodiments of the inventive concept, the nonvolatile memory comprises a cell array of a three-dimensional structure, the cell array of a three-dimensional structure comprises a plurality of cell strings arranged along rows and columns on a substrate, and each cell string comprises a plurality of charge trap type memory cells and at least one charge trap type select transistor stacked in a direction perpendicular to the substrate.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

FIG. 4 is a circuit diagram illustrating a memory block in accordance with exemplary embodiments of the inventive concept.

FIG. 8 is a table illustrating an example of information about read voltage offsets being managed by a memory controller.

FIG. 16 illustrates another example in which codewords are interleaved.

DETAILED DESCRIPTION

Figure 1:
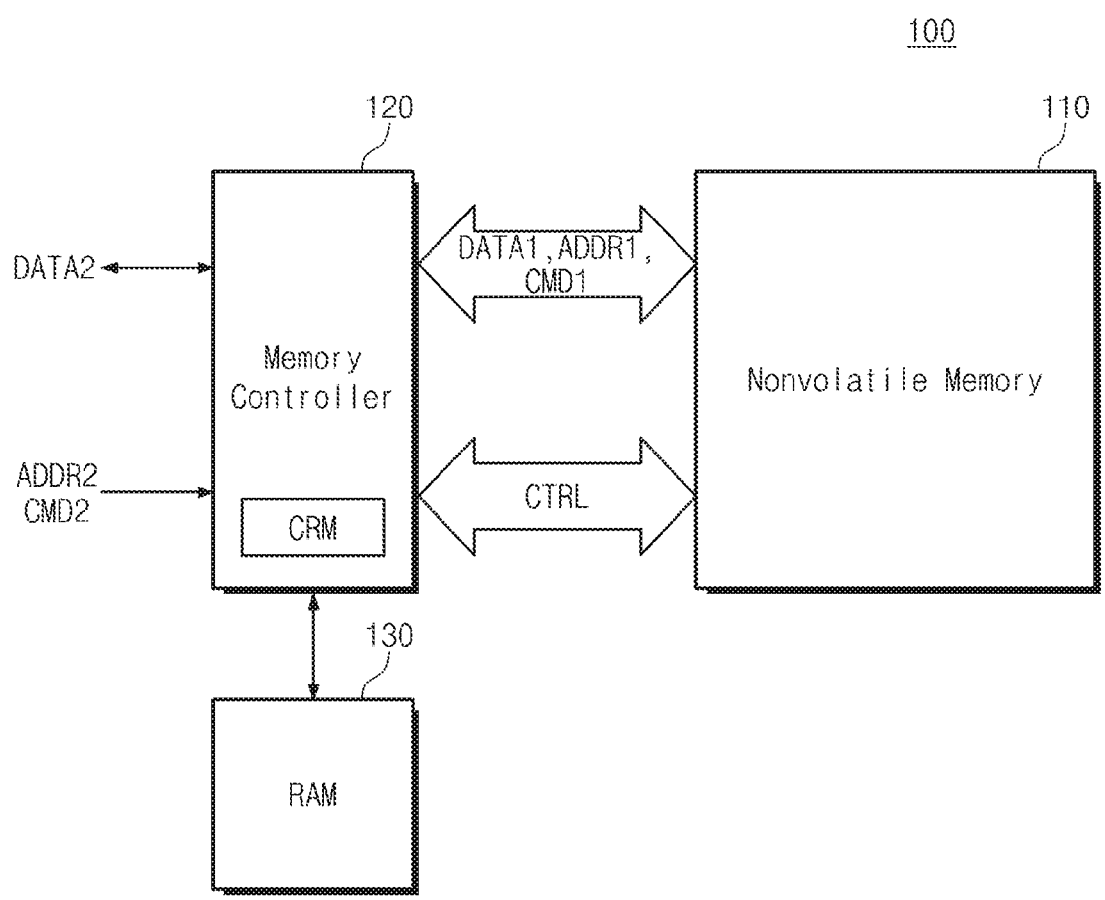
FIG. 1 is a block diagram illustrating a storage device in accordance with exemplary embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a storage device in accordance with exemplary embodiments of the inventive concept. Referring to FIG. 1, a storage device 100 includes a nonvolatile memory 110, a memory controller 120 and a RAM 130.

The nonvolatile memory 110 can perform write, read and erase operations under the control of the memory controller 120. The nonvolatile memory 110 can exchange first data DATA1 with the memory controller 120. For example, the nonvolatile memory 110 can receive first data DATA1 from the memory controller 120 and write the first data DATA1. The nonvolatile memory 110 can perform a read operation and output the read first data DATA1 to the memory controller 120.

The nonvolatile memory 110 can receive a first command CMD1 and a first address ADDR1 from the memory controller 120. The nonvolatile memory 110 can exchange a control signal CTRL with the memory controller 120. For example, the nonvolatile memory 110 can receive at least one of a chip select signal /CE selecting at least one semiconductor chip among a plurality of semiconductor chips constituting the nonvolatile memory 110, a command latch enable signal CLE indicating that a signal being received from the memory controller 120 is the first command CMD1, an address latch enable signal ALE indicating that a signal being received from the memory controller 120 is the first address ADDR1, a read enable signal /RE which is generated by the memory controller 120 in a read operation and periodically toggled to be used to adjust the timing, a write enable signal /WE activated by the memory controller 120 when the first command CMD1 or the first address ADDR1 is transmitted, a write preventing signal /WP activated by the memory controller 120 to prevent an unwanted erase or an unwanted write when power supply is changed, and a data strobe signal DQS which is generated by the memory controller 120 in a write operation and is periodically toggled to be used to adjust an input sync of the first data DATA1 from the memory controller 120. For example, the nonvolatile memory 110 can output at least one of a ready & busy signal R/nB indicating whether the nonvolatile memory 110 performs a program, erase or read operation, and a data strobe signal DQS which is generated from the read enable signal /RE by the nonvolatile memory 110 and is periodically toggled to be used to adjust an output sync of the first data DATA1 to the memory controller 120.

The first data DATA1, the first address ADDR1 and the first command CMD1 can be communicated with the memory controller 120 through a first channel. The first channel may be an input/output channel. The control signal CTRL can be communicated with the memory controller 120 through a second channel. The second channel may be a control channel.

The nonvolatile memory 110 may include a flash memory. However, the nonvolatile memory 110 is not limited to include a flash memory. The nonvolatile memory 110 may include at least one of various nonvolatile memories such as a PRAM (phase-change RAM), an MRAM (magnetic RAM), an RRAM (resistive RAM), a FeRAM (ferroelectric RAM), etc.

The memory controller 120 is configured to control the nonvolatile memory 110. For example, the memory controller 120 can control so that the nonvolatile memory 110 performs a write, read or erase operation. The memory controller 120 can exchange the first data DATA1 and the control signal CTRL with the nonvolatile memory 110 and output the first command CMD1 and the first address ADDR1 to the nonvolatile memory 110.

The memory controller 120 can control the nonvolatile memory 110 under the control of an external host device (not shown). The memory controller 120 can exchange second data DATA2 with the external host device and receive a second command CMD2 and a second address ADDR2 from the external host device.

The memory controller 120 can exchange the first data DATA1 with the nonvolatile memory 110 by a first unit (for example, time unit or data unit) and exchange the second data DATA2 with the host device by a second unit (for example, time unit or data unit) different from the first unit.

The memory controller 120 can exchange the first data DATA1 with the nonvolatile memory 110 according to a first format and transmit the first command CMD1 and the first address ADDR1 to the nonvolatile memory 110. The memory controller 120 can exchange the second data DATA2 with the host device according to a second format different from the first format and receive the second command CMD2 and the second address ADDR2 from the host device.

The memory controller 120 can use the RAM 130 as a buffer memory, a cache memory or an operation memory. For example, the memory controller 120 can receive the second data DATA2 from the host device, store the received second data DATA2 in the RAM 130 and write the second data DATA2 stored in the RAM 130 in the nonvolatile memory 110 as the first data DATA1. The memory controller 120 can read the first data DATA1 from the nonvolatile memory 110, store the read first data DATA1 in the RAM 130 and output the first data DATA1 stored in the RAM 130 to the host device as the second data DATA2. The memory controller 120 can store data read from the nonvolatile memory 110 in the RAM 130 and write data stored in the RAM 130 in the nonvolatile memory 110 again.

The memory controller 120 can store data or a code necessary for managing the nonvolatile memory 110 in the RAM 130. For example, the memory controller 120 can read data or a code necessary for managing the nonvolatile memory 110 from the nonvolatile memory 110 and load it into the RAM 130 to drive it.

The memory controller 120 includes a CRM (codeword read manager). The CRM can control the reading of a codeword stored in the nonvolatile memory 110. For example, a codeword may be data that has been written in the storage device 100 from an external device. The codeword may be a unit of an error correction operation. For example, the memory controller 120 can perform an error correction encoding by a codeword unit. A codeword by which an error correction encoding is performed is programmed in the nonvolatile memory 110. The memory controller 110 can control a read scheme under the control of the CRM and read codewords from the nonvolatile memory 110. The nonvolatile memory 110 can perform an error correction decoding with respect to the read codewords by a codeword unit.

A plurality of codewords may be programmed in a logical page of the nonvolatile memory 110. In the nonvolatile memory 110, a plurality of logical pages may correspond to a physical page. In the nonvolatile memory 110, a physical page may correspond to memory cells connected to a word line.

The RAM 130 may include at least one of various random access memories such as a DRAM (dynamic RAM), an SRAM (static RAM), a SDRAM (synchronous DRAM), a PRAM (phase-change RAM), an MRAM (magnetic RAM), an RRAM (resistive RAM), a FeRAM (ferroelectric RAM), etc.

To reduce an overhead that an erase operation occurs in the nonvolatile memory 110, the storage device 100 may perform an address mapping. For example, when an overwrite operation is requested from the external host device, the storage device 100 may store the overwrite-requested data in memory cells of a free storage space instead of erasing memory cells storing existing data to store the overwrite-requested data in the erased memory cells. The memory controller 120 can drive a FTL (flash translation layer) mapping a logical address being used in the external host device and a physical address being used in the nonvolatile memory 110 according to the method described above. For example, the second address ADDR2 may be a logical address and the first address ADDR1 may be a physical address.

The storage device 100 can perform a write, read or erase operation of data according to a request of the host device. The storage device 100 may include an SSD (solid state drive) or a HDD (hard disk drive). The storage device 100 may include memory cards such as a personal computer memory card international association (PCMCIA) card, a compact flash (CF) card, a smart media card (SM, SMC), a memory stick, a multimedia card (MMC, RS-MMC, MMC-micro), an SD card (SD, miniSD, microSD, SDHC), a universal flash memory device (UFS), etc. The storage device 100 may include a mounted memory such as an eMMC (embedded multimedia card), a UFS, a PPN (perfect page new), etc.

Figure 2:
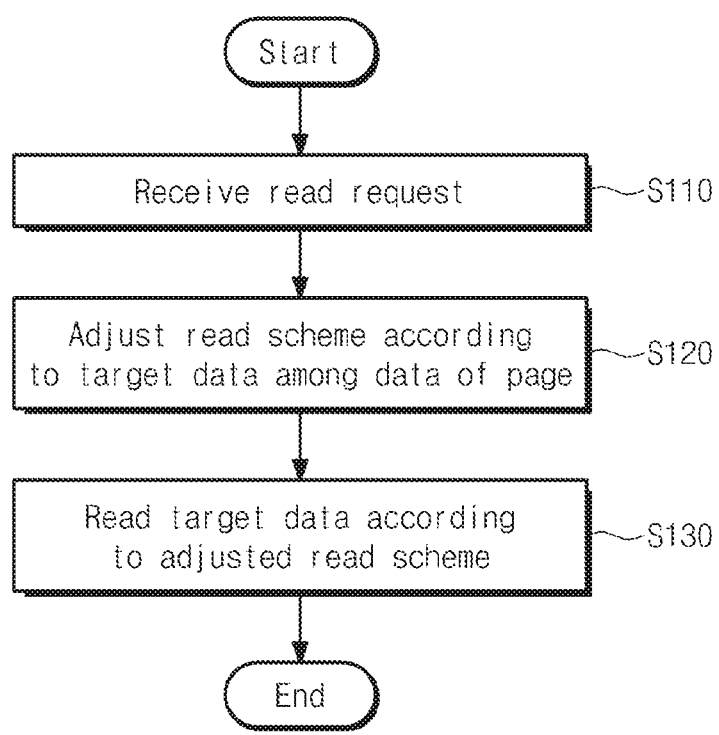
FIG. 2 is a flowchart illustrating an operating method of a storage device in accordance with exemplary embodiments of the inventive concept.

FIG. 2 is a flowchart illustrating an operating method of a storage device in accordance with exemplary embodiments of the inventive concept. Referring to FIGS. 1 and 2, in a step S110, the memory controller 120 receives a read request from an external device (for example, an external host device). The read request may include the second command CMD2 and the second address ADDR2. For example, the read request may request a read with respect to at least one codeword. The read request may request a read with respect to data of a page (for example, a logical page) or a part of data of a logical page.

In a step S120, the memory controller 120 adjusts a read scheme according to target data among logical page data. For example, the memory controller 120 can adjust a read scheme based on a location on a logical page of the target data or meta information associated with the target data. The meta information may include information being managed by the memory controller 120 to manage the storage device 100.

In a step S130, the memory controller 120 can read target data from the nonvolatile memory 110 according to an adjusted read scheme. For example, the memory controller 120 can read target data or data associated with the target data from the nonvolatile memory 110 according to an adjusted read scheme.

Figure 3:
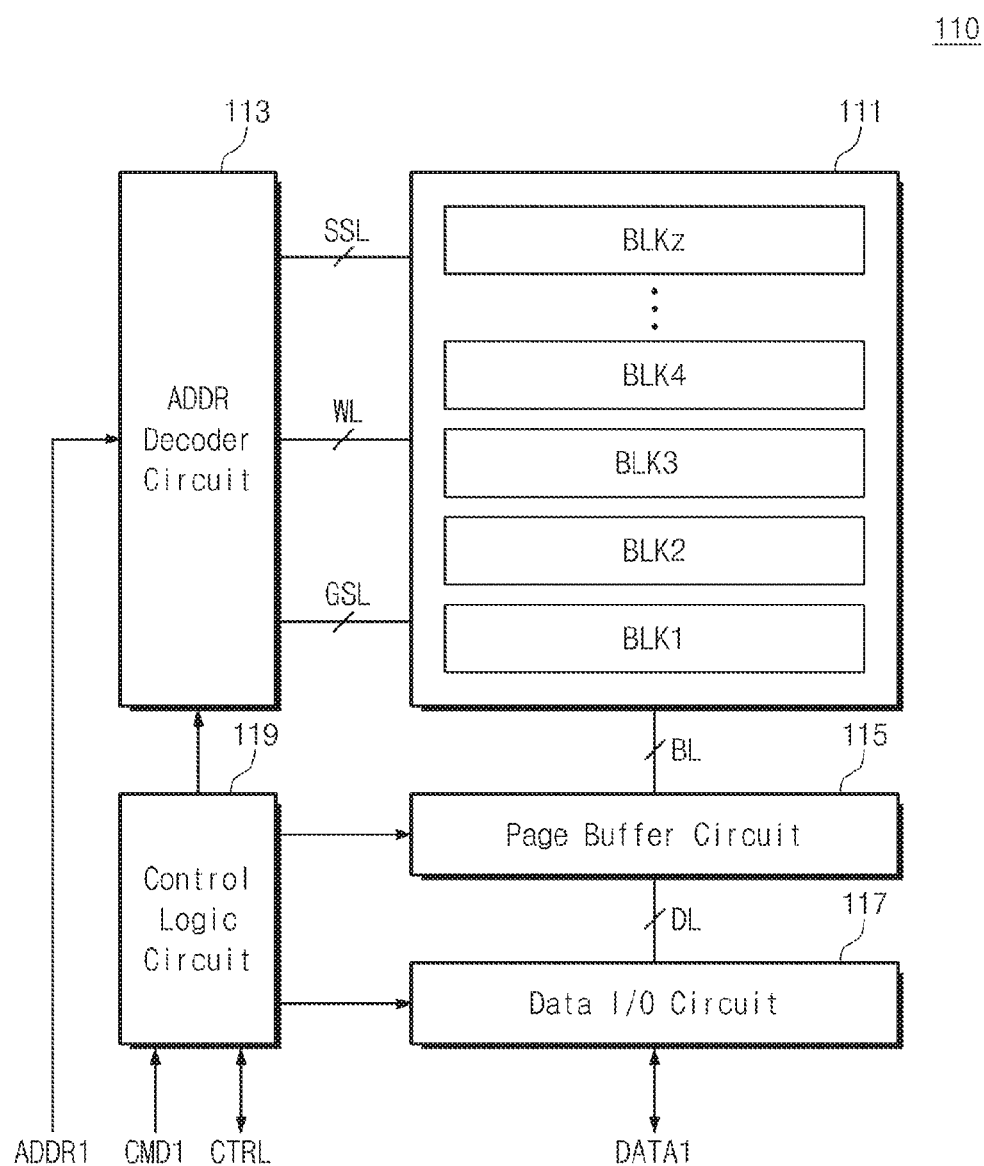
FIG. 3 is a block diagram illustrating a nonvolatile memory in accordance with exemplary embodiments of the inventive concept.

FIG. 3 is a block diagram illustrating a nonvolatile memory in accordance with exemplary embodiments of the inventive concept. Referring to FIGS. 1 and 3, the nonvolatile memory 110 includes a memory cell array 111, an address decoder circuit 113, a page buffer circuit 115, a data input/output circuit 117 and a control logic circuit 119.

The memory cell array 111 includes a plurality of memory blocks BLK1~BLKz. Each memory block includes a plurality of memory cells. Each memory block may be connected to the address decoder circuit 113 through at least one ground select line GSL, a plurality of word lines WL and at least one string select line SSL. Each memory block may be connected to the page buffer circuit 115 through a plurality of bit lines BL. The memory blocks BLK1~BLKz may be connected to the bit lines BL in common Memory cells of the memory blocks BLK1~BLKz may have the same structure. Each of the memory blocks BLK1~BLKz may be a unit of an erase operation. Memory cells of the memory cell array 111 may be erased by a memory block unit. Memory blocks that belong to one memory block may be erased at the same time. Each memory block may be divided into a plurality of sub blocks. Each of the sub blocks may be a unit of an erase operation.

The address decoder circuit 113 is connected to the memory cell array 111 through a plurality of ground select lines GSL, a plurality of word lines WL and a plurality of string select lines SSL. The address decoder circuit 113 operates under the control of the control logic circuit 119. The address decoder circuit 113 may receive a first address ADDR1 from a memory controller 120. The address decoder circuit 113 decodes the received first address ADDR1 and can control the voltages being applied to the word lines WL according to the decoded address.

For example, in a program operation, the address decoder circuit 113 may apply a program voltage VPGM to a selected word line of a selected memory block which the first address ADDR1 indicates and apply a pass voltage VPASS to unselected word lines of the selected memory block. In a read operation, the address decoder circuit 113 may apply a select read voltage VRD to a selected word line of a selected memory block which the first address ADDR1 indicates and apply an unselect read voltage VREAD to unselected word lines of the selected memory block. In an erase operation, the address decoder circuit 113 may apply erase voltages (for example, a ground voltage or low voltages having levels similar to the ground voltage) to word lines of a selected memory block which the first address ADDR1 indicates.

The page buffer circuit 115 is connected to the memory cell array 111 through a plurality of bit lines BL. The page buffer circuit 115 is connected to the data input/output circuit 117 through a plurality of data lines DL. The page buffer circuit 115 operates under the control of the control logic circuit 119.

The page buffer circuit 115 can store data to be programmed in memory cells of the memory cell array 111 or data being read from memory cells of the memory cell array 111. In a program operation, the page buffer circuit 115 can store data to be programmed in memory cells. The page buffer circuit 115 can bias a plurality of bit lines BL on the basis of the stored data. In a program operation, the page buffer circuit 115 can function as a write driver. In a read operation, the page buffer circuit 115 can sense voltages of bit lines BL and store a sensing result. In a read operation, the page buffer circuit 115 can function as a sense amplifier.

The data input/output circuit 117 is connected to the page buffer circuit 115 through a plurality of data lines DL. The data input/output circuit 117 can exchange first data DATA1 with the memory controller 120.

The data input/output circuit 117 can temporarily store first data DATA1 being received from the memory controller 120. The data input/output circuit 117 can transmit the stored data to the page buffer circuit 115. The data input/output circuit 117 can temporarily store data being transmitted from the page buffer circuit 115. The data input/output circuit 117 can transmit the stored data to the memory controller 120 as the first data DATA1. The data input/output circuit 117 can function as a buffer memory.

The control logic circuit 119 receives a first command CMD1 and a control signal CTRL from the memory controller 120. The control logic circuit 119 can decode the received first command CMD1 and control an overall operation of the nonvolatile memory 110 according to the decoded command.

In a read operation, the control logic circuit 119 can generate a data strobe signal DQS from a read enable signal /RE among the received control signal CTRL and output it. In a write operation, the control logic circuit 119 can receive a data strobe signal DQS included in the control signal CTRL.

FIG. 4 is a circuit diagram illustrating a memory block in accordance with exemplary embodiments of the inventive concept. Referring to FIG. 4, the memory block BLKa includes a plurality of cell strings CS11~CS21 and CS12~CS22. The cell strings CS11~CS21 and CS12~CS22 may be arranged along a row direction and a column direction to form rows and columns.

For example, the cell strings CS11 and CS12 arranged along a row direction may form a first row and the cell strings CS21 and CS22 arranged along the row direction may form a second row. The cell strings CS11 and CS21 arranged along a column direction may form a first column and the cell strings CS12 and CS22 arranged along the column direction may form a second column.

Each cell string may include a plurality of cell transistors. The cell transistors include ground select transistors GSTa and GSTb, memory cells MC1~MC6, and string select transistors SSTa and SSTb. The ground select transistors GSTa and GSTb, the memory cells MC1~MC6, and the string select transistors SSTa and SSTb of each cell string may be stacked in a direction perpendicular to a plane (for example, a plane of a substrate of the memory block BLKa) on which the cell strings CS11~CS21 and CS12~CS22 are arranged along rows and columns.

The cell transistors may be charge trap type transistors having threshold voltages that change depending on charge amount trapped by an insulating layer.

Sources of the lowermost ground select transistors GSTa may be connected to a common source line CSL in common.

Control gates of the ground select transistors GSTa of the first row cell strings CS11 and CS12 are connected to a ground select line GSL1a in common Control gates of the ground select transistors GSTa of the second row cell strings CS21 and CS22 are connected to a ground select line GSL2a in common Control gates of the ground select transistors GSTb of the first row cell strings CS11 and CS12 are connected to a ground select line GSL1b in common Control gates of the ground select transistors GSTb of the second row cell strings CS21 and CS22 are connected to a ground select line GSL2b in common.

Cell strings of different rows are connected to different ground select lines. Ground select transistors of the same height (or order) of cell strings of the same row are connected to the same ground select line. Ground select transistors of the different height (or order) of cell strings of the same row are connected to different ground select lines.

The memory block BLKa may be changed so that ground select lines connected to ground select transistors of different heights of the same row are connected to one another to be controlled in common. The memory block BLKa may be changed so that ground select lines connected to ground select transistors of the same height of the different rows are connected to one another to be controlled in common. The memory block BLKa may be changed so that ground select lines connected to ground select transistors are connected to one another to be controlled in common.

Control gates of memory cells located at the same height from a substrate (or ground select transistors GST) may be connected to one word line in common and control gates of memory cells located at different heights (or order) may be connected to different word lines WL1~WL6 respectively. For example, memory cells MC1 are connected to the word line WL1 in common Memory cells MC2 are connected to the word line WL2 in common Memory cells MC3 are connected to the word line WL3 in common Memory cells MC4 are connected to the word line WL4 in common Memory cells MC5 are connected to the word line WL5 in common Memory cells MC6 are connected to the word line WL6 in common.

At the first string select transistors SSTa of the same height (or order) of the cell strings CS11~CS21 and CS12~CS22, control gates of the first string select transistors SSTa of different rows are connected to different string select lines SSL1a~SSL2a respectively. For example, the first string select transistors SSTa of the cell strings CS11 and CS12 are connected to the string select line SSL1a in common. The first string select transistors SSTa of the cell strings CS21 and CS22 are connected to the string select line SSL2a in common.

At the second string select transistors SSTb of the same height (or order) of the cell strings CS11~CS21 and CS12~CS22, control gates of the second string select transistors SSTb of different rows are connected to different string select lines SSL1b~SSL2b respectively. For example, the second string select transistors SSTb of the cell strings CS11 and CS12 are connected to the string select line SSL1b in common. The second string select transistors SSTb of the cell strings CS21 and CS22 are connected to the string select line SSL2b in common.

That is, cell strings of different rows are connected to different string select lines. String select transistors of the same height (or order) of cell strings of the same row are connected to the same string select line. String select transistors of different heights (or order) of cell strings of the same row are connected to different string select lines.

String select transistors of cell strings of the same row may be connected to one string select line in common. For example, the string select transistors SSTa and SSTb of the first row cell strings CS11 and CS12 may be connected to one string select line in common. The string select transistors SSTa and SSTb of the second row cell strings CS21 and CS22 may be connected to one string select line in common.

Columns of the cell strings CS11~CS21 and CS12~CS22 are connected to different bit lines BL1 and BL2 respectively. For example, the string select transistors SST of the first column cell strings CS11~CS21 are connected to the bit line BL1 in common. The string select transistors SST of the second column cell strings CS12~CS22 are connected to the bit line BL2 in common.

The cell strings CS11 and CS12 may form a first plane. The cell strings CS21 and CS22 may form a second plane.

In the memory block BLKa, memory cells of each height of each plane may form a physical page. The physical page may be a write unit and a read unit of the memory cells MC1~MC6. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane are connected to the bit lines BL1 and BL2. That is, the first plane is selected.

When a turn-on voltage is supplied to the string select lines SSL2a and SSL2b and a turn-off voltage is supplied to the string select lines SSL1a and SSL1b, the cell strings CS21 and CS22 of the second plane are connected to the bit lines BL1 and BL2. That is, the second plane is selected.

In the selected plane, one row of the memory cells MC is selected by the word lines WL1~WL6. In the selected row, a select voltage is applied to the second word line WL2 and an unselect voltage may be applied to the remaining word lines WL1 and WL3~WL6. That is, a physical page corresponding to the second word line WL2 of the second plane may be selected by controlling voltages of the string select lines SSL1a, SSL1b, SSL2a and SSL2b and the word lines WL1~WL6. In the memory cells MC2 of the selected physical page, a write or read operation may be performed.

At least two bits may be written in each of the memory cells MC. Bits being written in each of memory cells MC that belongs to one physical page form logical pages. A first bit being written in each of memory cells MC that belongs to one physical page forms a first logical page. An Nth bit being written in each of memory cells MC that belongs to one physical page forms an Nth logical page. The logical page may be a data access unit. When a read operation is performed in one physical page, data may be accessed by a logical page unit.

In the memory block BLKa, an erase of the memory cells MC1~MC6 may be performed by a memory block unit or a sub block unit. When an erase operation is performed by a memory block unit, the memory cells MC of the memory block BLKa may be all erased at the same time according to one erase request (for example, an erase request from an external memory controller). When an erase operation is performed by a sub block unit, parts of the memory cells MC1~MC6 may be erased at the same time according to one erase request (for example, an erase request from an external memory controller) and the remaining parts of the memory cells MC1~MC6 may be erase-prohibited. A low voltage (for example, a ground voltage or a low voltage having a similar level to the ground voltage) is supplied to a word line connected to memory cells MC being erased and a word line connected to erase-prohibited memory cells MC may be floated.

The memory block BLKa illustrated in FIG. 4 is illustrative. A technical spirit of the inventive concept is not limited to the memory block BLKa illustrated in FIG. 4. For example, the number of rows of cell strings may increase or decrease. As the number of rows of cell strings is changed, the number of string select lines or ground select lines connected to the rows of the cell strings and the number of cell strings connected to one bit line may also be changed.

The number of columns of cell strings may increase or decrease. As the number of columns of cell strings is changed, the number of bit lines connected to the columns of the cell strings and the number of cell strings connected to one string select line may also be changed.

Heights of cell strings may increase or decrease. For example, the number of ground select transistors, memory cells or string select transistors that are stacked on each cell string may increase or decrease.

Memory cells MC that belong to one physical page can correspond to at least three logical pages. For example, k (k is an integer greater than 2) number of bits can be programmed in one memory cell MC. In memory cells MC that belong to one physical page, k number of bits being programmed in each memory cell MC can form k number of logical pages respectively.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, which word lines and/or bit lines shared between levels: U.S. Pat. Nos. 7,679,133; 8,553,466; 8,654,587; 8,559,235; and US Pat. Pub. No. 2011/0233648.

Figure 5:
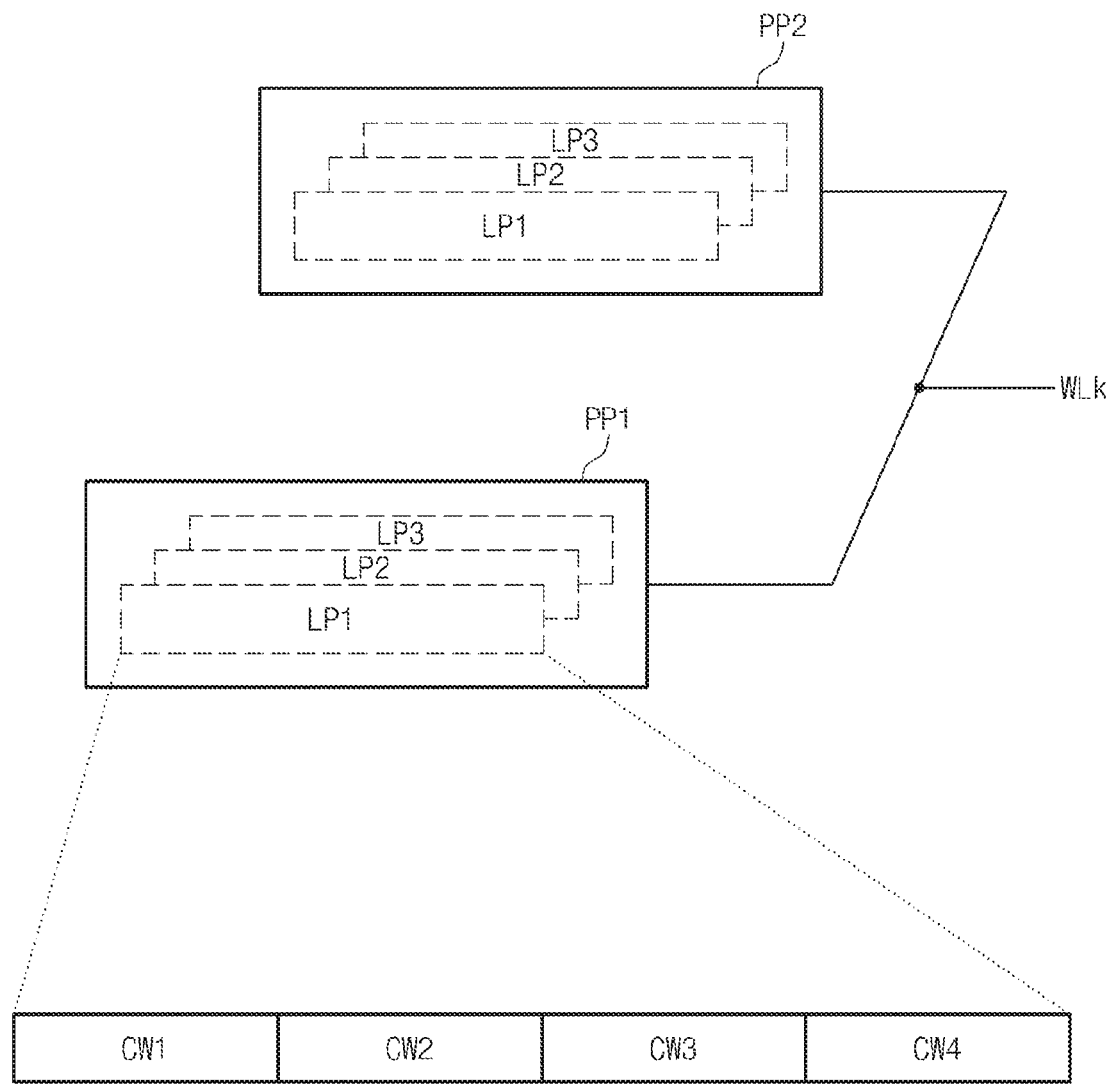
FIG. 5 illustrates examples of physical pages and logical pages corresponding to memory cells connected to a kth word line.

FIG. 5 illustrates examples of physical pages PP1 and PP2 and logical pages LP1~LP3 corresponding to memory cells MC connected to a kth word line WLk (k being a positive integer). Referring to FIGS. 4 and 5, memory cells MC corresponding to first string select lines SSL1a and SSL1b of the first row among the memory cells MC connected to the kth word line WLk can form a first physical page PP1. Memory cells MC corresponding to second string select lines SSL2a and SSL2b of the second row among the memory cells MC connected to the kth word line WLk can form a second physical page PP2. In FIG. 5, it is illustrated that the memory cells MC connected to the kth word line WLk form two physical pages. However, the number of physical pages is determined according to the number of rows of memory cells connected to a word line WL and is not limited.

A plurality of bits may be programmed in each of the memory cells MC of each of the physical pages PP1 and PP2. A first bit being programmed in each of memory cells MC of each physical page may form a first logical page LP1. A second bit being programmed in each of memory cells MC of each physical page may form a second logical page LP2. A third bit being programmed in each of memory cells MC of each physical page may form a third logical page LP3. In FIG. 5, it is illustrated that each physical page corresponds to three logical pages LP1 to LP3. However, the number of logical pages corresponding to each physical page is determined by the number of bits being programmed in each memory cell and is not limited.

A plurality of codewords CW1~CW4 is programmed in each of the logical pages LP1, LP2 and LP3. That is, each codeword may be a partial data of data of one of logical pages LP1, LP2, and LP3. The codewords CW1~CW4 may be independently error-correction encoded data.

According to exemplary embodiments of the inventive concept, a read scheme is adjusted according to a codeword which is a read target among the codewords CW1~CW4 programmed in a logical page, that is, partial data of the logical page.

In FIG. 5, two physical pages are illustrated, but the number of the physical pages connected to a word line is not limited thereto. In FIG. 5, three logical pages per a physical page are illustrated, but the number of the logical pages per a physical page it not limited thereto. In FIG. 5, four codewords per a logical page are illustrated, but the number of the codewords per a logical page is not limited thereto.

Figure 6:
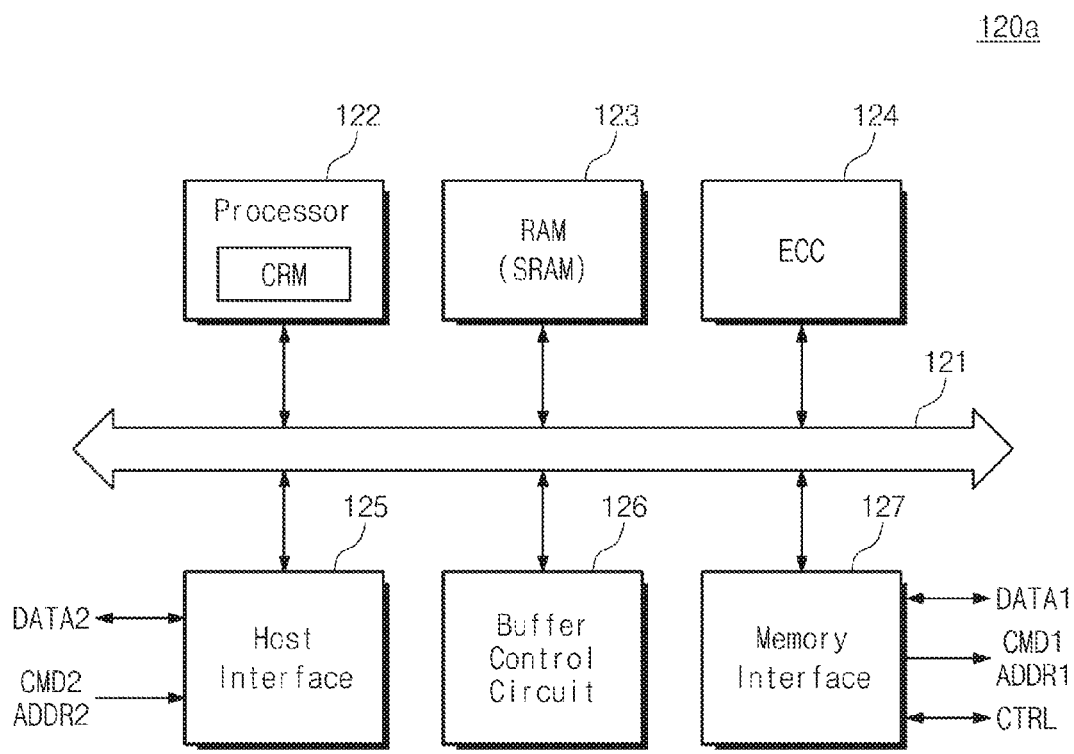
FIG. 6 is a block diagram illustrating a memory controller in accordance with a first embodiment of the inventive concept.

FIG. 6 is a block diagram illustrating a memory controller 120a in accordance with a first embodiment of the inventive concept. Referring to FIG. 6, the memory controller 120a includes a bus 121, a processor 122, a RAM 123, an ECC (error correction code) block 124, a host interface 125, a buffer control circuit 126 and a memory interface 127.

The bus 121 is configured to provide a channel among constituent elements of the memory controller 120a.

The processor 122 can control an overall operation of the memory controller 120a and perform a logical operation. The processor 122 can communicate with an external host device through the host interface 125. The processor 122 can store the second command CMD2 and the second address ADDR2 being received through the host interface 125 in the RAM 123. The processor 122 can generate the first command CMD1 and the first address ADDR1 according to the second command CMD2 and the second address ADDR2 stored in the RAM 123 and output the generated first command CMD1 and the first address ADDR1 through the memory interface 127.

The processor 122 can output the second data DATA2 being received through the host interface 125 through the buffer control circuit 126 or store the second data DATA2 in the RAM 123. The processor 122 can output data stored in the RAM 123 or data being received through the buffer control circuit 126 through the memory interface 127 as the first data DATA1. The processor 122 can store the first data being received through the memory interface 127 in the RAM 123 or output the first data DATA1 through the buffer control circuit 126. The processor 122 can output data stored in the RAM 123 or data being received through the buffer control circuit 126 through the host interface 125 as the second data DATA2 or through the memory interface 127 as the first data DATA1.

The processor 122 includes a codeword read manager CRM. The codeword read manager CRM is a part of the processor 122 and may be embodied in a hardware form. The codeword read manager CRM may be embodied in a firmware form being driven in the processor 122.

The RAM 123 may be used as an operation memory, a cache memory or a buffer memory of the processor 122. The RAM 123 can store codes and commands being executed by the processor 122. The RAM 123 can store data being processed by the processor 122. The RAM 123 may include a SRAM (static RAM).

The ECC block 124 can perform an error correction operation. The ECC block 124 can generate an error correction code (for example, parity) for performing an error correction on the basis of the first data DATA1 to be output to the memory interface 127 or the second data DATA2 being received from the host interface 125. The first data DATA1 and the parity can be output through the memory interface 127. The ECC block 124 can perform an error correction of the received first data DATA1 using the first data DATA1 and the parity being received through the memory interface 127. The ECC block 124 may be included in the memory interface 127 as a constituent element of the memory interface 127.

The host interface 125 is configured to communicate with an external host device under the control of the processor 122. The host interface 125 can receive the second command CMD2 and the second address ADDR2 from the external host device and exchange the second data DATA2 with the external host device.

The host interface 125 may be configured to perform a communication using at least one of many different communication methods such as a universal serial bus (USB), a serial at attachment (SATA), a serial attachment SCSI (SAS), a high speed interchip (HSIC), a small computer small interface (SCSI), a Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), etc.

The buffer controller circuit 126 is configured to control the RAM 130 (refer to FIG. 1) under the control of the processor 122. The buffer control circuit 126 can write data in the RAM 130 and read data from the RAM 130.

The memory interface 127 is configured to communicate with the nonvolatile memory 110 (refer to FIG. 1) under the control of the processor 122. The memory interface 127 can transmit the first command CMD1 and the first address ADDR1 to the nonvolatile memory 110 and exchange the first data DATA1 and the control signal CTRL with the nonvolatile memory 110.

The RAM 130 may not be provided to the storage device 100. That is, the storage device 100 may not have a separate memory outside the memory controller 120a and the nonvolatile memory 110. At this time, the buffer control circuit 126 may not be provided to the memory controller 120a. A function of the RAM 130 may be performed by the internal RAM 123 of the memory controller 120a.

As an illustration, the processor 122 can control the memory controller 120 using codes. The processor 122 can load codes from nonvolatile memory (for example, read only memory) being provided inside the memory controller 120. As another illustration, the processor 122 can load codes being received from the memory interface 127.

The bus 121 of the memory controller 120 may be divided into a control bus and a data bus. The data bus may be configured to transmit data in the memory controller 120a and the control bus may be configured to transmit control information such as a command, an address, etc. in the memory controller 120a. The data bus and the control bus may be separated from each other and may not interfere or affect each other. The data bus may be connected to the host interface 125, the buffer control circuit 126, the ECC (error correction code) block 124 and the memory interface 127. The control bus may be connected to the host interface 125, the processor 122, the buffer control circuit 126, RAM 123 and the memory interface 127.

Figure 7:
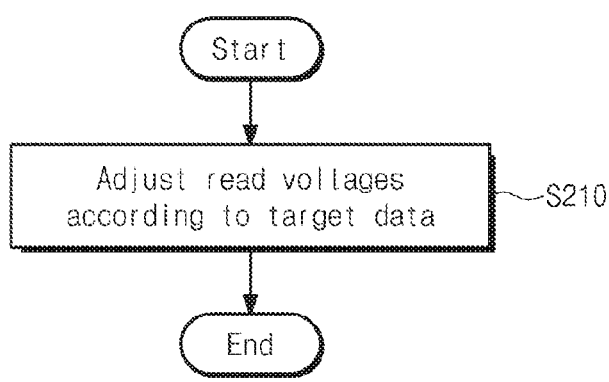
FIG. 7 is a flowchart illustrating a method of adjusting a read scheme according to a first embodiment of the inventive concept.

FIG. 7 is a flowchart illustrating a method of adjusting a read scheme according to a first embodiment of the inventive concept. Referring to FIGS. 1, 4, 6 and 7, in a step S210, the memory controller 120a, for example, the codeword read manager CRM can adjust read voltages according to target data.

The nonvolatile memory 110 can support a read with respect to data of a unit smaller than a logical page. For example, the nonvolatile memory 110 can support a partial read. The memory controller 120a, for example, the codeword read manager CRM can manage information about read voltage offsets corresponding to read units respectively that belong to each page (or logical page) according to a unit of the partial read supported by the nonvolatile memory 110. An example of the information about read voltage offsets being managed by the memory controller 120a is illustrated in FIG. 8.

Referring to FIGS. 1, 4, 6, 7 and 8, a unit of a partial read of the nonvolatile memory 110 may correspond to one codeword or two codewords. In the case that the unit of a partial read of the nonvolatile memory 110 corresponds to one codeword and target data of the partial read is the first codeword CW1, the memory controller 120a can control the nonvolatile memory 110 to adjust levels of read voltages according to a first voltage offset VOFF1. The nonvolatile memory 110, using the adjusted read voltages, can read the first codeword CW1 and output the read first codeword CW1 to the memory controller 120a. In the partial read operation, the nonvolatile memory 110 may not output the remaining codewords CW2~CW4 to the memory controller 120a. Similarly, in the case that the unit of a partial read of the nonvolatile memory 110 corresponds to one codeword and target data of the partial read is one of the codewords CW2~CW4, the memory controller 120a can control the nonvolatile memory 110 to adjust levels of read voltages according to a corresponding voltage offset VOFF among second through fourth voltage offsets VOFF2~VOFF4.

In the case that the unit of the partial read of the nonvolatile memory 110 corresponds to two codewords and target data of the partial read are the first and second codewords CW1 and CW2, the memory controller 120a can control the nonvolatile memory 110 to adjust levels of read voltages according to a fifth voltage offset VOFF5. The nonvolatile memory 110 reads the first and second codewords CW1 and CW2 using the adjusted read voltages and can output the read first and second codewords CW1 and CW2 to the memory controller 120a. In the partial read operation, the nonvolatile memory 110 may not output the remaining codewords CW3 and CW4 to the memory controller 120a. Similarly, in the case that the unit of the partial read corresponds to two codewords and the target data of the partial read are the third and fourth codewords CW3 and CW4, the memory controller 120a can control the nonvolatile memory 110 to adjust levels of read voltages according to a sixth voltage offset VOFF6.

Voltage offsets, which are set according to the unit of the partial read, may be used according to the whole read request with respect to the whole data stored in a physical page or a logical page. For example, the first through fourth codewords CW1~CW4 may be read at the same time according to the whole read request. In the case that an error correction decoding with respect to at least one of the first through fourth codewords CW1~CW4 fails, a partial read may be performed using corresponding voltage offset. For example, the memory controller 120a may perform a partial read with respect to a codeword in which an error correction decoding fails.

The memory controller 120a may manage information about the voltage offsets VOFF1 to VOFF6 as meta information. For example, the memory controller 120a can store meta information in a meta area set to store meta information in a storage space of the nonvolatile memory 110. When a power supply is supplied to the storage device 100 or information of the voltage offsets VOFF is needed, or according to a predetermined schedule, the memory controller 120a can read information of the voltage offsets VOFF1 to VOFF6 from the meta area of the nonvolatile memory 110 to load the read information into the RAM 130 or 123. Using the information of the voltage offsets VOFF1 to VOFF6 loaded into the RAM 130 or 123, the nonvolatile memory 110 can control so that the nonvolatile memory 110 adjusts levels of read voltage by a partial read unit smaller than a logical page.

Characteristics of memory cells that belong to a physical page may be different from one another. As described above, if levels of read voltage are adjusted by the partial read unit, a read reflecting the different characteristics of the memory cells may be performed. Thus, reliability of the nonvolatile memory 110 and the storage device 100 including the nonvolatile memory 110 may be improved.

Information of the offsets VOFF1 to VOFF6 may be set with respect to physical pages PP including memory cells MC having low reliability. Information of the offsets VOFF1 to VOFF6 may not be set with respect to physical pages PP including memory cells MC having high reliability. Information of the offsets VOFF may be selectively set with respect to physical pages PP of the nonvolatile memory 110.

In an embodiment, the number of codewords per a logical page is not limited and variable or adjustable according to various parameters or attributes of the memory block BLKa. For example, the number of codewords per a logical page or the number of offsets per a logical page may be varied or adjusted according to reliability of the memory block BLKa.

Figure 9:
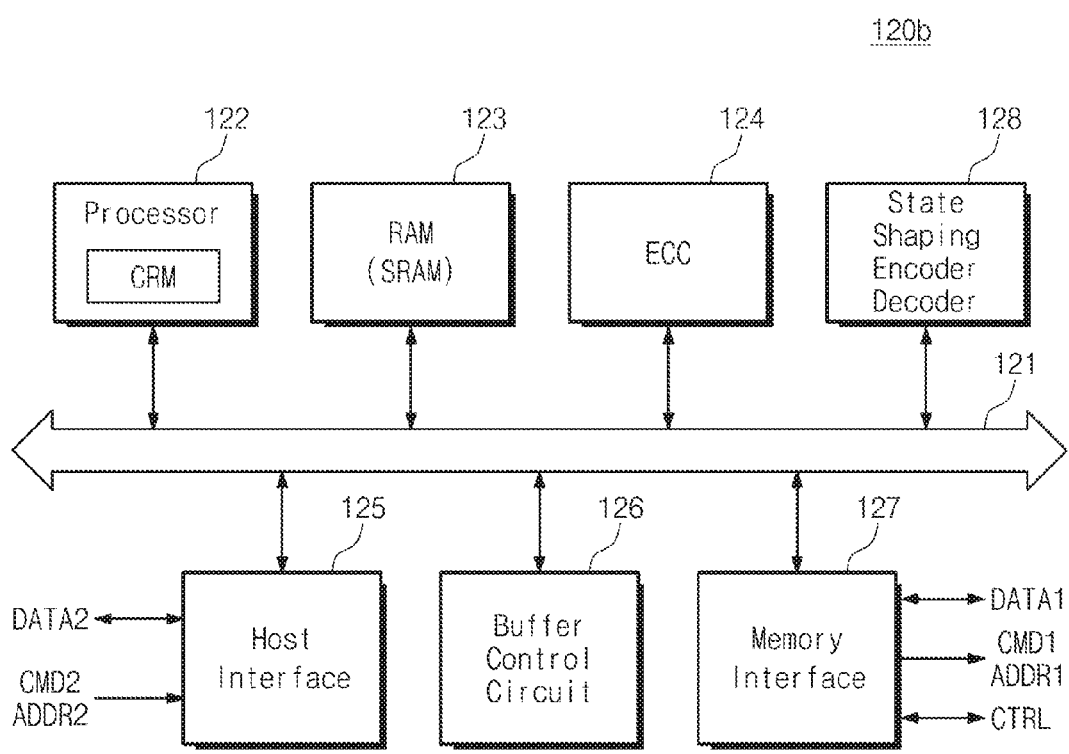
FIG. 9 is a block diagram illustrating a memory controller in accordance with a second embodiment of the inventive concept.

FIG. 9 is a block diagram illustrating a memory controller in accordance with a second embodiment of the inventive concept. Referring to FIG. 9, the memory controller 120b includes a bus 121, a processor 122, a RAM 123, an ECC (error correction code) block 124, a host interface 125, a buffer control circuit 126, a memory interface 127 and a state shaping encoder & decoder 128. The memory controller 120b further includes the state shaping encoder & decoder 128 compared with the memory controller 120a.

The state shaping encoder & decoder 128 can perform a state shaping encoding. The state shaping encoding may convert ratios of programmed states of codewords to be ununiform. The state shaping decoding may restore the encoded codewords to original codewords. For example, the state shaping encoding may increase or decrease the number of bits having '1' or '0' among bits of codewords. For example, the state shaping encoder & decoder 128 can perform a state shaping encoding using state shaping parities being further provided in addition to the codeword. A reduction rate of bits having '1' or '0' being reduced by the state shaping encoding may be different depending on the number of bits of the state shaping parities. The state shaping encoded codewords, or the state shaping encoded codewords and the state shaping parities may be error-correction encoded by the ECC (error correction code) block 124. The error-correction encoded codewords may be written in the nonvolatile memory 110 through the memory interface 127.

Codewords read by the nonvolatile memory 110 may be received through the memory interface 127. The ECC (error correction code) block 124 may perform an error correction decoding with respect to the codewords received through the memory interface 127. The state shaping encoder & decoder 128 may receive the error correction decoded codewords and the state shaping parities through the memory interface 127. The state shaping encoder & decoder 128 can perform a state shaping decoding with respect to codewords using the state shaping parities.

The memory controller 120b can adjust a program scheme of a codeword according to a state of a physical page or a logical page of the nonvolatile memory 110 in which a codeword is to be programmed. The memory controller 120b, for example, the read manager CRM can adjust a read scheme according to target data by a read request.

Figure 10:
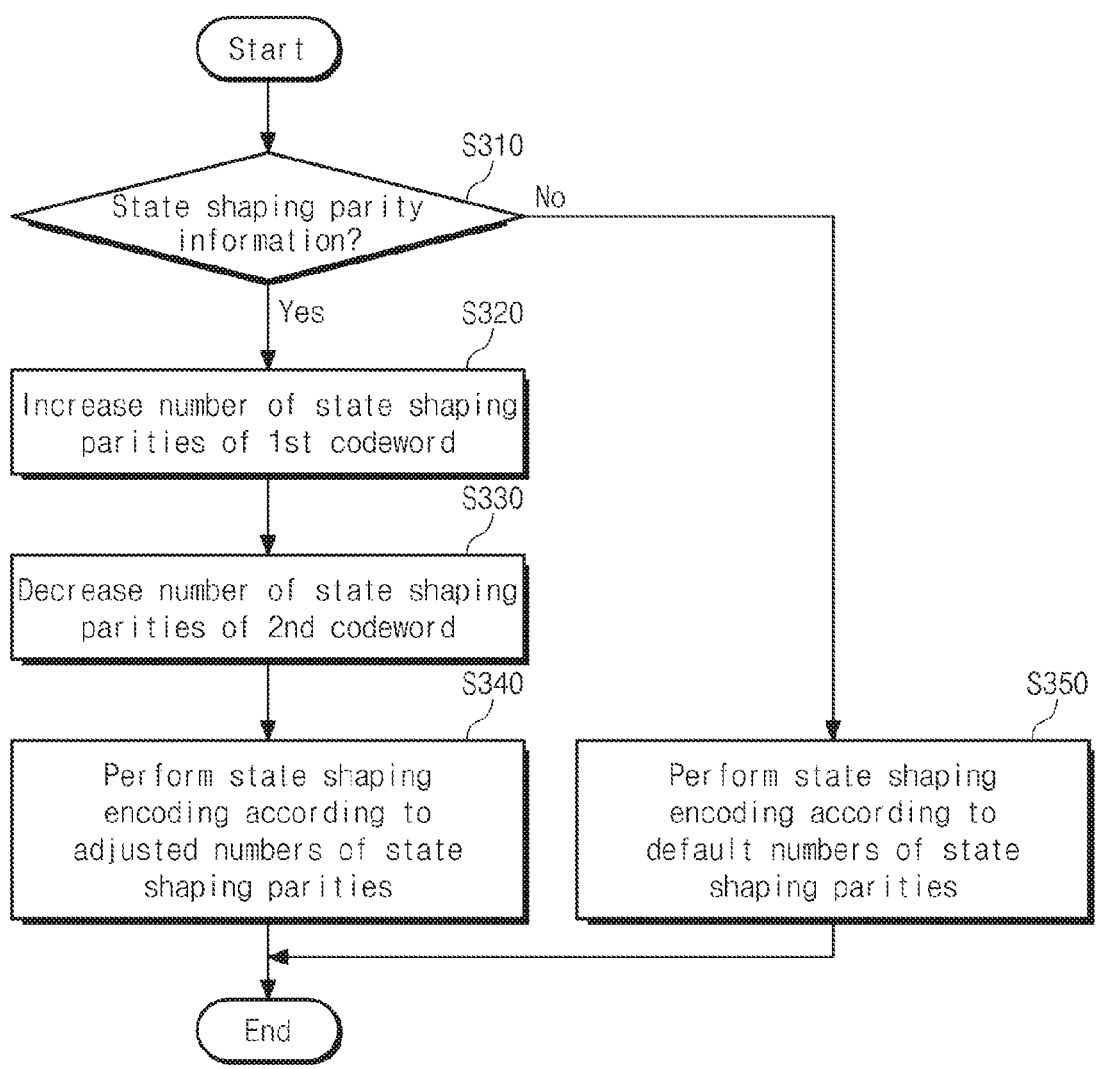
FIG. 10 is a flowchart illustrating a method in which a memory controller programs codewords in a nonvolatile memory. (S320 에 오타수정 parties→parities FIG. 11 illustrates examples in which a status shaping encoding is performed according to the number of status shaping parities set to a basic value.

FIG. 10 is a flowchart illustrating a method in which the memory controller 120b programs codewords in the nonvolatile memory 110. Referring to FIGS. 1, 3, 4, 9 and 10, in a step S310, the memory controller 120b determines whether information of state shaping parity exists. For example, the information of the state shaping parity may include parities, ratios of desired states, type of state shaping algorithm, etc For example, the memory controller 120b can determine whether information of state shaping parity associated with a physical page or a logical page corresponding to a write request from an external host device exists.

If the information of state shaping parity exists, in a step S320, the memory controller 120b increases the number of the state shaping parities of a first codeword according to the information of the state shaping parity. In a step S330, the memory controller 120b decreases the number of the state shaping parities of a second codeword according to the information of the state shaping parity. After that, in a step S340, the memory controller 120b performs a state shaping encoding with respect to the first and second codewords according to the number of the adjusted state shaping parities.

If the information of state shaping parity does not exist, in a step S350, the memory controller 120b performs a state shaping encoding with respect to the first and second codewords according to the number of the state shaping parities set to a default value.

Figure 11:
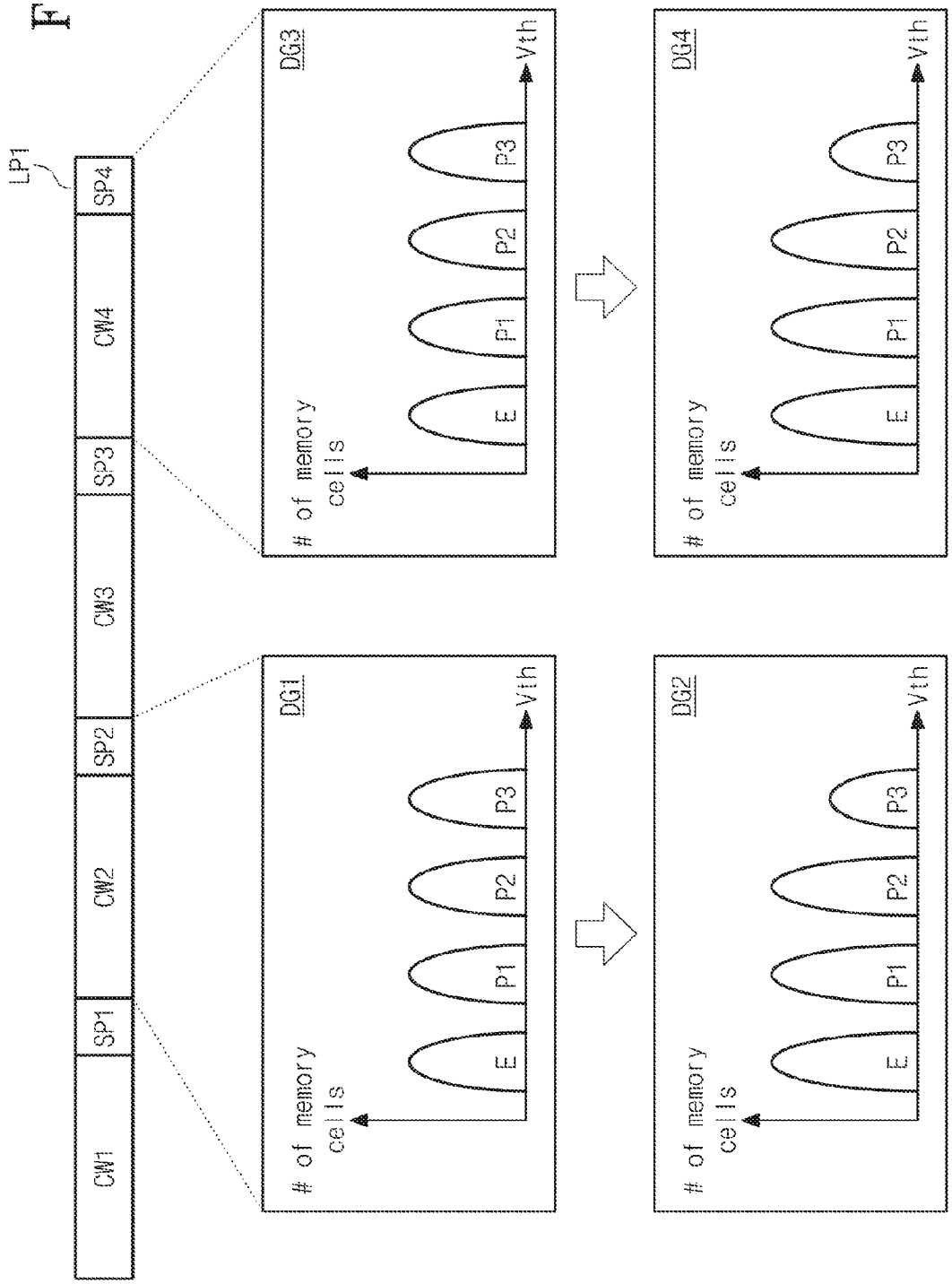

An example in which the state shaping encoding is performed according to the number of the state shaping parities set to the default value is illustrated in FIG. 11. Referring to FIG. 11, first through fourth state shaping parities SP1~SP4 are assigned to the first through fourth codewords CW1~CW4. When the number of the first through fourth state shaping parities SP1~SP4 is set to the default value, the number of bits of the first through fourth state shaping parities SP1~SP4 may be the same.

In FIG. 11, the first through fourth codewords CW1~CW4 and the first through fourth state shaping parities SP1~SP4 corresponding to a first logical page LP1 are illustrated. The number of state shaping parities SP of other logical pages LP2 and LP3 sharing the first logical page LP1 and the physical page PP may be set to be the same as the number of state shaping parities of the first through fourth state shaping parities SP1~SP4 of the first logical page LP1. For example, the second and third logical pages LP2 and LP3, the number of state shaping parities SP may be set to the basic value.

An example in which the second codeword CW2 is state-shaping encoded according to the second state shaping parity SP2 is illustrated in first and second distribution graphs DG1 and DG2. An example in which the fourth codeword CW4 is state-shaping encoded according to the fourth state shaping parity SP4 is illustrated in third and fourth distribution graphs DG3 and DG4. In the first through fourth distribution graphs DG1~DG4, a horizontal axis indicates a threshold voltage Vth of the memory cells and a vertical axis indicates the number of memory cells. For brevity of description, it is assumed that two logical pages LP1 and LP2 are programmed in one physical page PP. However, a description with reference to FIG. 11 is not limited thereto.

The first distribution graph DG1, in the case that the second codeword CW2 of the first and second logical pages LP1 and LP2 are programmed without the state shaping encoding, illustrates an example of threshold voltages of the memory cells in which the second codeword CW2 is programmed. The memory cells in which the second codeword CW2 is programmed may have an erase state E and first through third program states P1~P3. In the case that the state shaping encoding is not performed, it is assumed that the number of memory cells that belong to the erase state E and the first through third program states P1~P3 is substantially the same.

The second distribution graph DG2, in the case that the second codeword CW2 of the first and second logical pages LP1 and LP2 are programmed after the state shaping encoding, illustrates an example of threshold voltages of the memory cells MC in which the second codeword CW2 is programmed. If the state shaping encoding is performed, the number of the erase state E and the first through third program states P1~P3 is adjusted in comparison with the first distribution graph DG1. For example, if the state shaping encoding is performed, the number of the third program state P3 may decrease and the number of the erase state E and the first and second program states P1 and P2 may increase. That is, by adjusting states of the programmed memory cells MC, the state shaping encoding prevents data from being lost by stress due to high threshold voltages.

When the state shaping encoding is performed, the degree in which the number of the erase state E and the first through third program states P1~P3 is adjusted is determined by the number of bits of the state shaping parities SP. For example, if the number of bits of the state shaping parities SP increases, the number of the erase state E and the first through third program states P1~P3 may be more adjusted through the state shaping encoding. If the number of bits of the state shaping parities SP decreases, the number of the erase state E and the first through third program states P1~P3 may be less adjusted through the state shaping encoding.

In FIG. 11, it is assumed that the number of bits of the first through fourth state shaping parities SP1~SP4 is substantially the same. Thus, the degree in which the number of states corresponding to the second codewords CW2 is adjusted through the state shaping encoding may be the same as the degree in which the number of states corresponding to the fourth codewords CW4 is adjusted through the state shaping encoding. An example of the state shaping encoding shown by the third and fourth distribution graphs DG3 and DG4 may be the same as an example of the state shaping encoding shown by the first and second distribution graphs DG1 and DG2.

Figure 12:
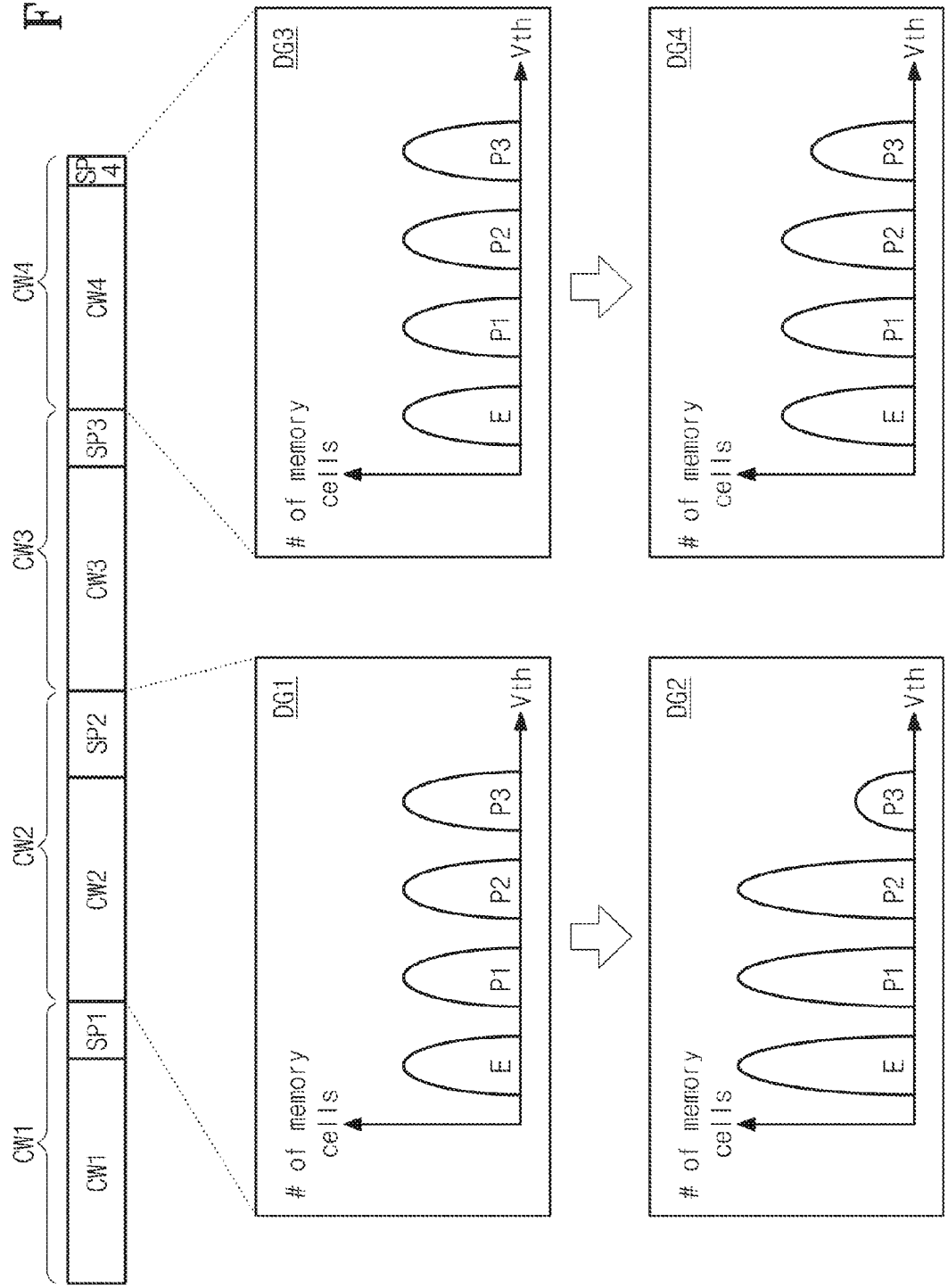
FIG. 12 illustrates examples in which a status shaping encoding is performed when the number of bits of status shaping parities is adjusted.

An example in which the state shaping encoding is performed when the number of bits of the state shaping parities is adjusted is illustrated in FIG. 12. Referring to FIG. 12, first through fourth shaping parities SP1~SP4 are assigned to first through fourth codewords CW1~CW4. The number of the first and third state shaping parities SP1 and SP3 may be set to a default value. The number of bits of the second state shaping parity SP2 may be set to be greater than the default value. The number of bits of the fourth state shaping parity SP4 may be set to be smaller than the default value.

An example in which the second codeword CW2 is state-shaping encoded according to the second state shaping parity SP2 is illustrated in first and second distribution graphs DG1 and DG2. An example in which the fourth codeword CW4 is state-shaping encoded according to the fourth state shaping parity SP4 is illustrated in third and fourth distribution graphs DG3 and DG4. In the first through fourth distribution graphs DG1~DG4, a horizontal axis indicates a threshold voltage Vth of the memory cells and a vertical axis indicates the number of memory cells. For brevity of description, it is assumed that two logical pages LP1 and LP2 are programmed in one physical page PP. However, a description with reference to FIG. 12 is not limited thereto.

The first distribution graph DG1, in the case that the second codeword CW2 of the first and second logical pages LP1 and LP2 are programmed without the state shaping encoding, illustrates an example of threshold voltages of the memory cells MC in which the second codeword CW2 is programmed. The second distribution graph DG2, in the case that the second codeword CW2 of the first and second logical pages LP1 and LP2 are programmed after the state shaping encoding, illustrates an example of threshold voltages of the memory cells MC in which the second codeword CW2 is programmed.

The number of bits of the second state shaping parity SP2 of FIG. 12 is greater than the number of bits of the second state shaping parity SP2 of FIG. 11. Thus, the degree in which the number of a third program state P3 is reduced through the state shaping encoding in the first and second distribution graphs DG1 and DG2 of FIG. 12 is greater that the degree in which the number of the third program state P3 is reduced through the state shaping encoding in the first and second distribution graphs DG1 and DG2 of FIG. 11. The degree in which the number of an erase state E and first and second program states P1 and P2 increases in the first and second distribution graphs DG1 and DG2 of FIG. 12 is greater than the degree in which the number of the erase state E and the first and second program states P1 and P2 increases in the first and second distribution graphs DG1 and DG2 of FIG. 11.

The number of bits of the fourth state shaping parities SP4 of FIG. 12 is smaller than the number of bits of the fourth state shaping parities SP4 of FIG. 11. Thus, the degree in which the number of the third program state P3 is reduced through the state shaping encoding in the third and fourth distribution graphs DG3 and DG4 of FIG. 12 is smaller than the degree in which the number of the third program state P3 is reduced through the state shaping encoding in the third and fourth distribution graphs DG3 and DG4 of FIG. 11. The degree in which the number of an erase state E and first and second program states P1 and P2 increases in the third and fourth distribution graphs DG3 and DG4 of FIG. 12 is smaller than the degree in which the number of the erase state E and the first and second program states P1 and P2 increases in the third and fourth distribution graphs DG3 and DG4 of FIG. 11.

Figure 13:
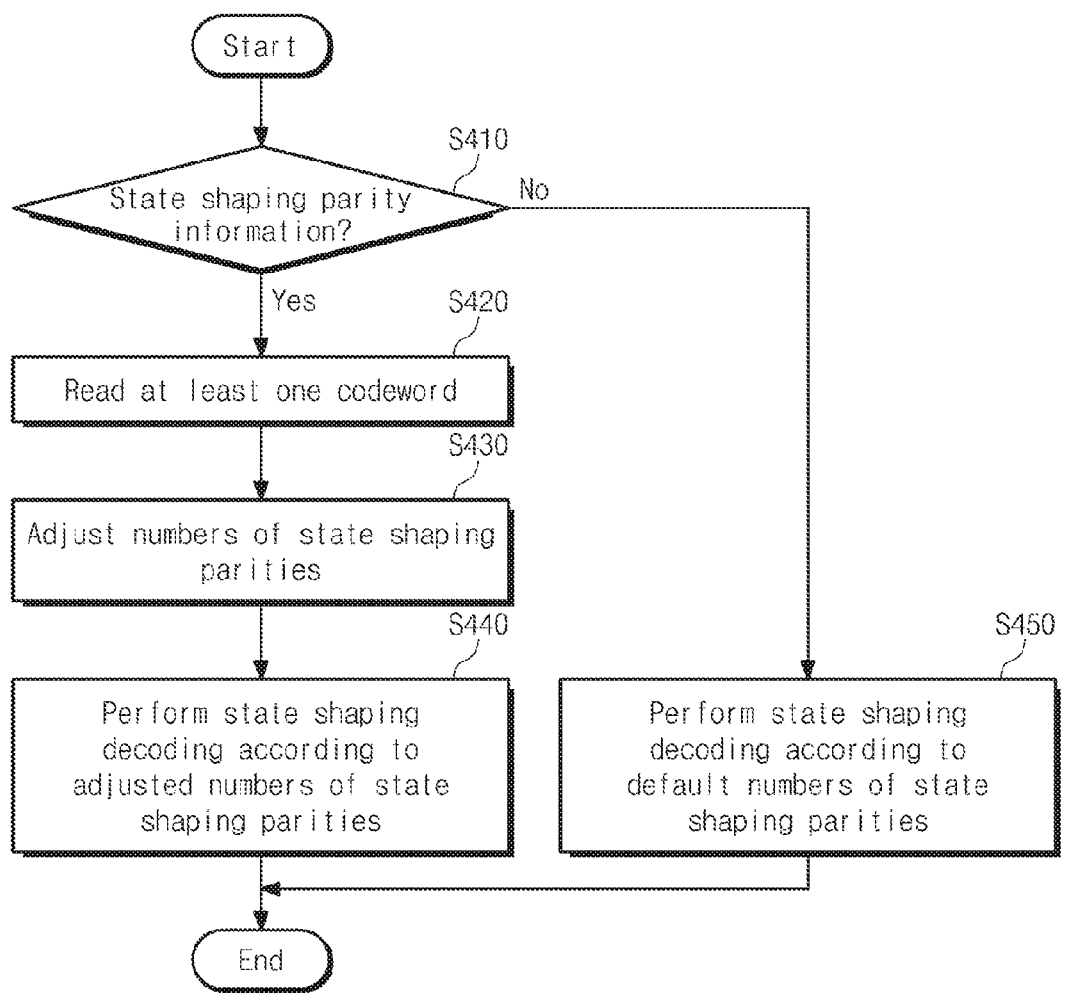
FIG. 13 is a flowchart illustrating a method in which a memory controller reads codewords from a nonvolatile memory.

FIG. 13 is a flowchart illustrating a method in which a memory controller 120b reads codewords from a nonvolatile memory 110. Referring to FIGS. 1, 3, 4, 9 and 13, in a step S410, the memory controller 120b, for example, a CRM (code read manager) determines whether information of state shaping parity exists. For example, the memory controller 120b can determine whether information of state shaping parity associated with a physical page or a logical page corresponding to a read request from an external host device exists.

If the information of state shaping parity exists, in a step S420, the memory controller 120b can read at least one codeword from the nonvolatile memory 110 according to a read request. The memory controller 120b, for example, the CRM (code read manager) adjusts the number of state shaping parities according to the information of state shaping parity. In a step S440, the memory controller 120b performs a state shaping decoding according to the number of the adjusted state shaping parities.

If the information of state shaping parity does not exist, in a step S450, the memory controller 120b can perform the state shaping decoding according to the number of the state shaping parities set to a basic value.

As the number of the state shaping parities SP increases, the probability that stress deteriorating reliability of data occurs is reduced. That is, as the number of bits of the state shaping parity SP increases, reliability of data increases. Thus, by increasing the number of bits of the state shaping parity SP of a codeword CW being programmed in memory cells of low reliability in a physical page and decreasing the number of bits of the state shaping parity SP of a codeword CW being programmed in memory cells of high reliability in a physical page, reliability of the memory cells of the physical page may be standardized while not increasing the number of whole bits of the state shaping parities SP. If reliability of the memory cells is standardized, the probability that a burst error occurs is reduced and thereby reliability of the nonvolatile memory 110 and the storage device 100 including the nonvolatile memory 110 is improved.

The memory controller 120b can manage the information of the state shaping parity as meta information. For example, the memory controller 120b can store meta information in a meta area set to store meta information in a storage space of the nonvolatile memory 110. When a power supply is supplied to the storage device 100 or the information of the state shaping parity is needed, or according to a predetermined schedule, the memory controller 120b can read the information of the state shaping parity from the meta area of the nonvolatile memory 110 to load the read information into the RAM (130 or 123). Using the information of the state shaping parity loaded into the RAM (130 or 123), the nonvolatile memory 110 adjusts the number of bits of the state shaping parity in a write or read operation.

Information of the state shaping parity may be set with respect to physical pages PP including memory cells MC having low reliability. Information of the state shaping parity may not be set with respect to physical pages PP including memory cells MC having high reliability. Information of the state shaping parity may be selectively set with respect to physical pages PP of the nonvolatile memory 110.

Figure 14:
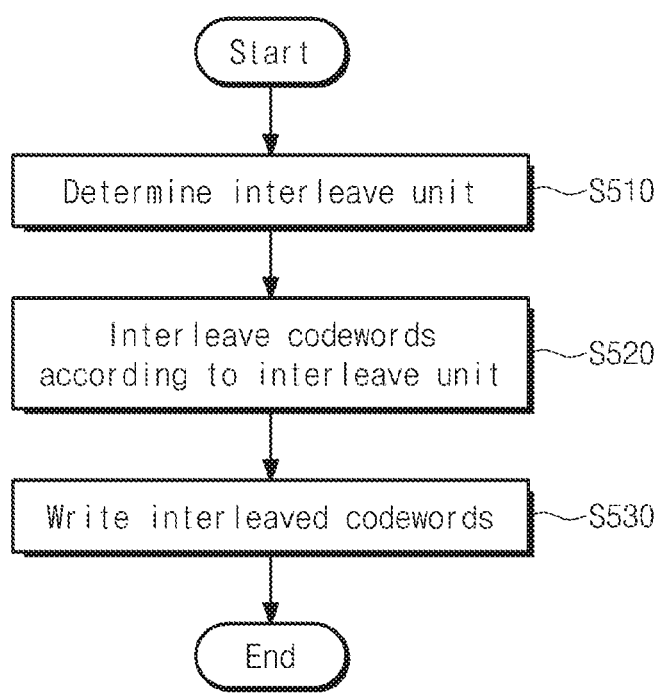
FIG. 14 is a flowchart illustrating a method in which a memory controller programs data in a nonvolatile memory.

FIG. 14 is a flowchart illustrating a method in which a memory controller 120 programs data in a nonvolatile memory 110. Referring to FIGS. 1, 3, 4 and 14, in a step S510, the memory controller 120 determines an interleave unit. In a step S520, the memory controller 120 interleaves codewords to be programmed in the nonvolatile memory 110 according to the determined interleave unit. In a step S530, the interleaved codewords are written in the nonvolatile memory 110. The interleaving means an operation of combining partial data from data corresponding to the interleave unit to combine new data. Examples of the interleaving include a block interleaving, a random interleaving, and a uniform interleaving.

Figure 15:
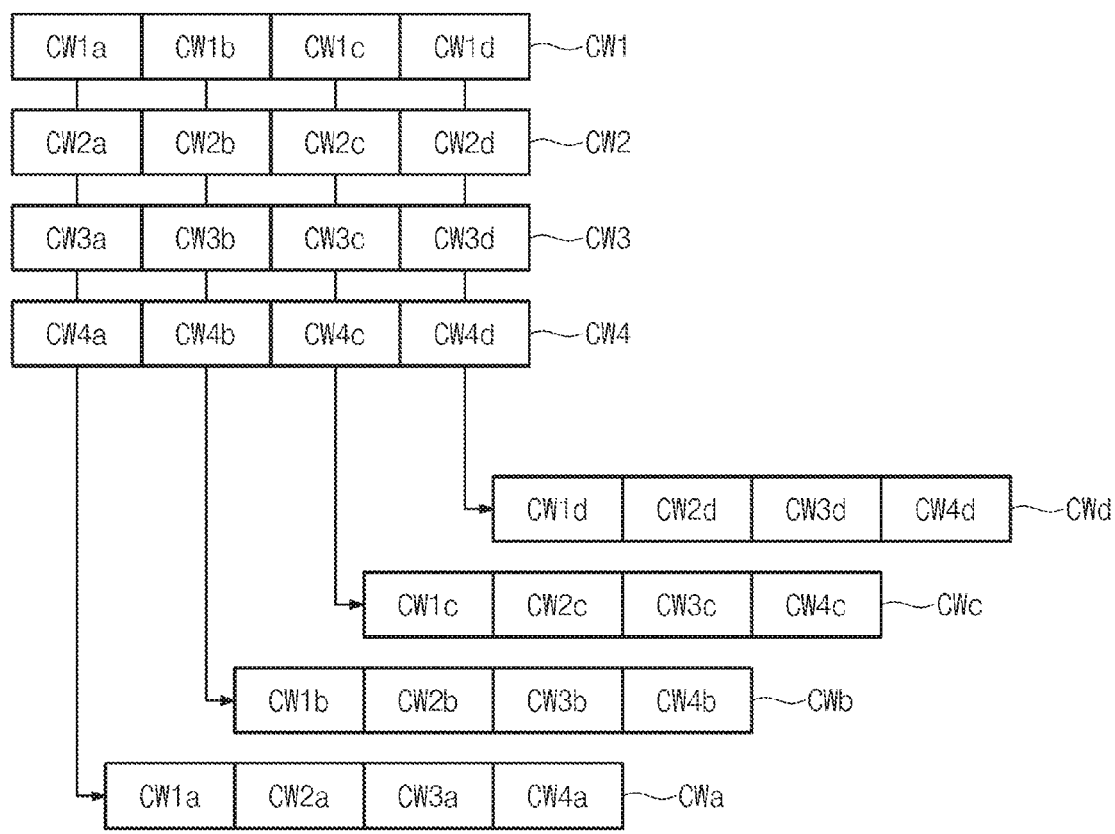
FIG. 15 illustrates an example in which codewords are interleaved.

FIG. 15 illustrates an example in which codewords are interleaved. Referring to FIG. 15, first through fourth codewords CW1~CW4 are interleaved. That is, an interleave unit may be the four codewords.

The memory controller 120 can interleave the first through fourth codewords CW1~CW4 being sequentially received from an external host device to program the interleaved codewords in a page (for example, a logical page or a physical page) of the nonvolatile memory 110 instead of sequentially programming the first through fourth codewords CW1~CW4 being sequentially received from an external host device in a page (for example, a logical page or a physical page) of the nonvolatile memory 110. For example, the interleaving may be an operation of combining partial data of each of the first through fourth codewords CW1~CW4 to generate new codewords. Each of the new codewords may include partial data of at least two codewords.

The memory controller 120 can combine first partial data CW1a~CW4a of the first through fourth codewords CW1~CW4 to generate a new codeword CWa, combine second partial data CW1b~CW4b of the first through fourth codewords CW1~CW4 to generate a new codeword CWb, combine third partial data CW1c~CW4c of the first through fourth codewords CW1~CW4 to generate a new codeword CWc and combine fourth partial data CW1d~CW4d of the first through fourth codewords CW1~CW4 to generate a new codeword CWd. The interleaved codewords CWa~CWd may be programmed in a logical page of the nonvolatile memory 110.

FIG. 16 illustrates another example in which codewords are interleaved. Referring to FIG. 16, first and second codewords CW1 and CW2 are interleaved and third and fourth codewords CW3 and CW4 are interleaved. That is, an interleave unit may be two codewords.

The memory controller 120 can combine first and second partial data CW1a, CW2a, CW1b and CW2b of the first and second codewords CW1 and CW2 to generate a new codeword CWa and combine third and fourth partial data CW1c, CW2c, CW1d and CW2d of the first and second codewords CW1 and CW2 to generate a new codeword CWb. The memory controller 120 can combine first and second partial data CW3a, CW4a, CW3b and CW4b of the third and fourth codewords CW3 and CW4 to generate a new codeword CWc and combine third and fourth partial data CW3c, CW4c, CW3d and CW4d of the third and fourth codewords CW3 and CW4 to generate a new codeword CWd.

Figure 17:
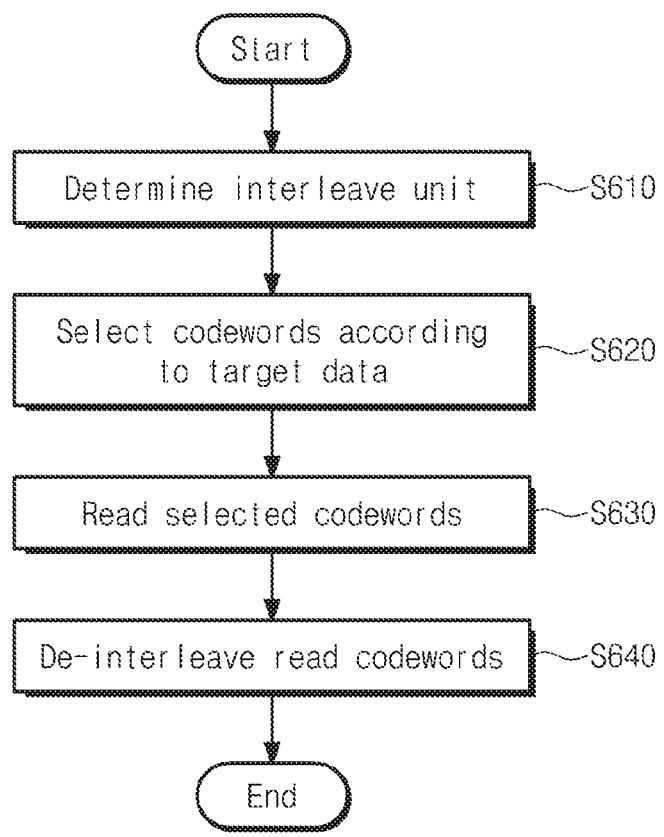
FIG. 17 is a flowchart illustrating a method in which a memory controller reads data from a nonvolatile memory.

FIG. 17 is a flowchart illustrating a method in which a memory controller reads data from a nonvolatile memory. Referring to FIGS. 1, 3, 4 and 17, in a step S610, the memory controller 120 determines an interleave unit. In a step S620, the memory controller 120 selects codewords to be read from the nonvolatile memory 110 according to the determined interleave unit and target data in accordance with a read request. For example, the memory controller 120 can select not only target data in accordance with a read request but also codewords of an interleave unit to which the target data belongs. The memory controller 120 can select the whole codewords necessary for performing a de-interleave operation of the target data. The memory controller 120 can select a codeword to which the target data in accordance with a read request belongs. By an interleave operation, data of a codeword is distributed to be stored on a logical page of the nonvolatile memory 110. Thus, the memory controller 120 can select partial data corresponding to the codeword to which the target data in accordance with a read request belongs. That is, the memory controller 120 can adjust a read scheme by adjusting a read target range according to the target data in accordance with a read request and the interleave unit. In a step S630, the memory controller 120 reads the selected codewords from the nonvolatile memory 110. In a step S640, the memory controller 120 de-interleaves the read codewords.

According to the embodiment described above, codewords being written in a logical page (or a physical page), for example, partial data being programmed in a logical page (or a physical page) is interleaved or de-interleaved with one another. Thus, an error rate according to a location of memory cells MC corresponding to a logical page (or a physical page) is standardized and reliability of the nonvolatile memory 110 and the storage device 100 including the nonvolatile memory 110 is improved.

The memory controller 120b can manage information of an interleave unit as meta information. For example, the memory controller 120b can store information of an interleave unit in a meta area set to store meta information in a storage space of the nonvolatile memory 110. When a power supply is supplied to the storage device 100 or the information of the state shaping parity is needed, or according to a predetermined schedule, the memory controller 120b can read the information of an interleave unit from the meta area of the nonvolatile memory 110 to load the read information into the RAM (130 or 123). Using the information of an interleave unit loaded into the RAM (130 or 123), the nonvolatile memory 110 can adjust a read target range in a read operation.

According to reliability of memory cells MC of the physical pages PP, interleave units of the physical pages PP may be differently set. According to reliability of memory cells MC of planes of the memory block BLKa, interleave units of the memory cells MC of planes of the memory block BLKa may be differently set. According to reliability of memory cells MC of the memory block BLKa, interleave units of the memory block BLKa may be differently set.

Figure 18:
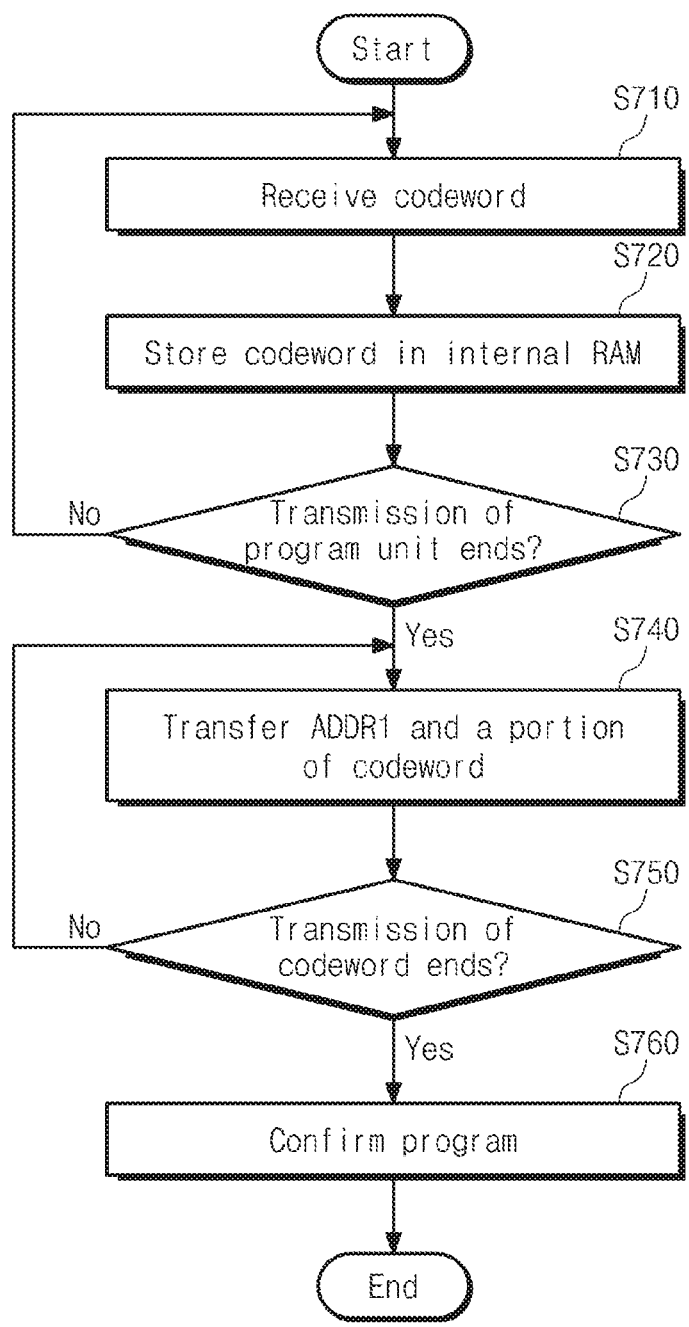
FIG. 18 is a flowchart illustrating a first example in which a memory controller interleaves codewords.

FIG. 18 is a flowchart illustrating a first example in which a memory controller interleaves codewords. Referring to FIGS. 1, 3, 4 and 18, the storage device 100 can interleave codewords without using the RAM 130. For example, an operating method of FIG. 18 can be applied to a storage device not including the RAN 130.

In a step S710, the memory controller 120 can receive a codeword from an external host device. In a step S720, the memory controller 120 may store the received codeword in the internal RAM 123 (refer to FIG. 6 or 9). The steps S710 and S720 may be repeated until codewords corresponding to a program unit of the nonvolatile memory 110 are received (a step S730). For example, the memory controller 120 may repeat the steps S710 and S720 until codewords to be programmed in at least one physical page or at least one logical page of the nonvolatile memory 110 are received.

In a step S740, the memory controller 120 can transmit partial data of the codeword and the first address ADDR1 to the nonvolatile memory 110. The memory controller 120 may repeat the step S740 until a transmission of codewords to be programmed is completed (a step S750).

For example, the memory controller 120 can sequentially transmit partial data of the selected codeword to the nonvolatile memory 110. The first address ADDR1 can be transmitted together with the partial data of the selected codeword. A value of the first address ADDR1 may discontinuously increase. For example, in the example described with reference to FIG. 16, the memory controller 120 can transmit the first partial data CW1a of the first codeword CW1 together with the first address ADDR1 indicating a first location of the new codeword CWa. The memory controller 120 can transmit the second partial data CW1b of the first codeword CW1 together with the first address ADDR1 indicating a third location of the new codeword CWa. The memory controller 120 can transmit the third partial data CW1c of the first codeword CW1 together with the first address ADDR1 indicating a first location of the new codeword CWb. The memory controller 120 can transmit the fourth partial data CW1d of the first codeword CW1 together with the first address ADDR1 indicating a third location of the new codeword CWb. If a transmission of the selected codeword is completed, the memory controller 120 selects a next codeword and transmits the selected codeword.

The memory controller 120 can sequentially transmit partial data of codewords to be interleaved to the nonvolatile memory 110. The continuously increasing first address ADDR1 may be transmitted together with partial data of codewords to be interleaved. For example, in the example described with reference to FIG. 16, the memory controller 120 can transmit the first partial data CW1a of the first codeword CW1 together with the first address ADDR1 indicating a first location of the new codeword CWa. The memory controller 120 can transmit the first partial data CW2a of the second codeword CW2 together with the first address ADDR1 indicating a second location of the new codeword CWa. The memory controller 120 can transmit the second partial data CW1b of the first codeword CW1 together with the first address ADDR1 indicating a third location of the new codeword CWa. The memory controller 120 can transmit the second partial data CW2b of the second codeword CW2 together with the first address ADDR1 indicating a fourth location of the new codeword CWa.

If a transmission of codewords to be programmed is completed, in a step S760, the memory controller 120 can instruct the nonvolatile memory 110 to begin a program.

That is, the memory controller 120 can interleave codewords by mixing and loading partial data of the codewords when loading the codewords into the nonvolatile memory 110.

In a read operation, the memory controller 120 can control the nonvolatile memory 110 to read codewords that belong to at least one interleave unit. The memory controller 120 can receive the codewords that belong to the interleave unit from the nonvolatile memory 110. The memory controller 120 can perform an error correction decoding with respect to a codeword corresponding to a read request among the received codewords and output the error-correction decoded codeword to an external host device.

The memory controller 120 can control the nonvolatile memory 110 to read a codeword corresponding to the read request. The memory controller 120 can perform an error correction decoding with respect to the read codeword and output the error-correction decoded codeword to an external host device.

Figure 19:
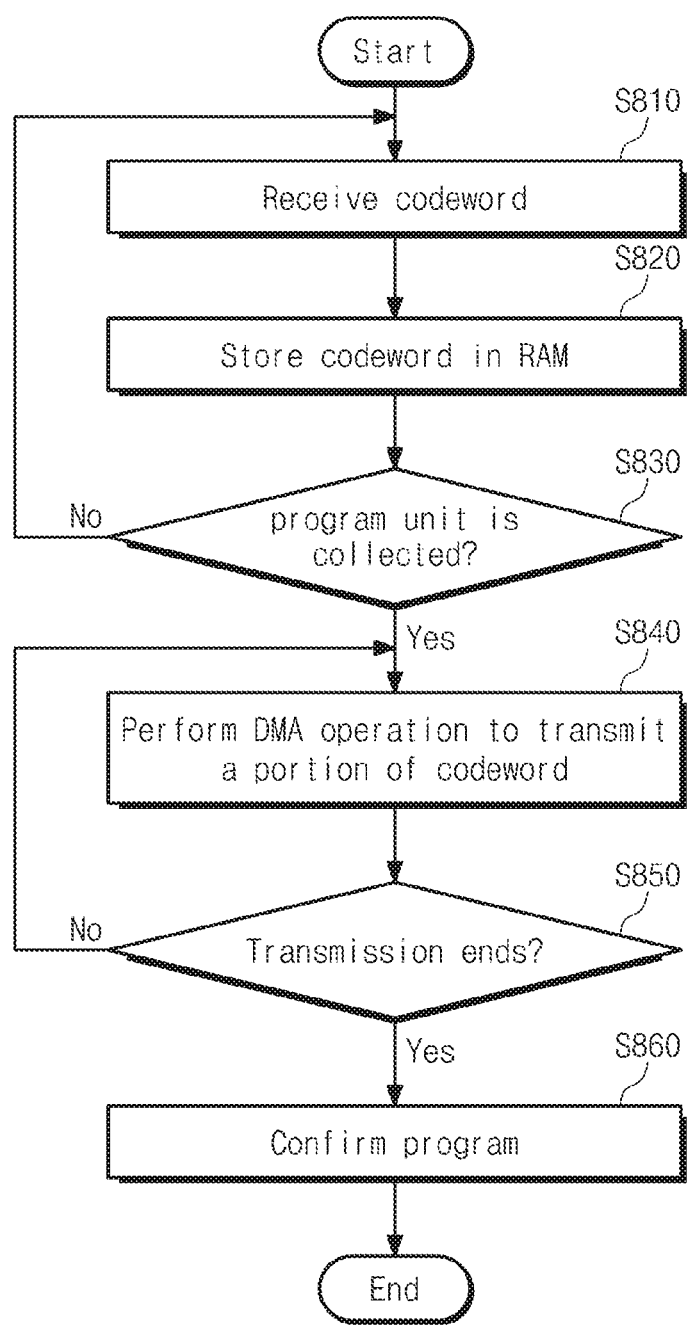
FIG. 19 is a flowchart illustrating a second example in which a memory controller interleaves codewords.

FIG. 19 is a flowchart illustrating a second example in which a memory controller interleaves codewords. Referring to FIGS. 1, 3, 4 and 19, the storage device 100 can interleave codewords using the RAM 130.

In a step S810, the memory controller 120 can receive a codeword from an external host device. In a step S820, the memory controller 120 can store the received codeword in an external RAM 130. The steps S810 and S820 are repeated until codewords corresponding to a program unit of the nonvolatile memory 110 are received or collected (step S830).

In a step S840, the memory controller 120 can perform a Direct Memory Access (DMA) operation so that partial data of the codeword is transmitted to the nonvolatile memory 110. For example, the memory controller 120 may include a DMA controller. The memory controller 120 can program the DMA controller to transmit partial data of the codeword to the nonvolatile memory 110. The memory controller 120 may repeat the step S840 until a transmission of codewords to be programmed is completed (a step S850).

For example, the memory controller 120 may perform a DMA operation so that partial data of the selected codeword is sequentially transmitted to the nonvolatile memory 110. For example, in the example described with reference to FIG. 16, the memory controller 120 can program a DMA controller so that the first partial data CW1a of the first codeword CW1 is loaded into a first location of the new codeword CWa. The memory controller 120 can program a DMA controller so that the second partial data CW1b of the first codeword CW1 is loaded into a third location of the new codeword CWa. The memory controller 120 can program a DMA controller so that the third partial data CW1c of the first codeword CW1 is loaded into a first location of the new codeword CWb. The memory controller 120 can program a DMA controller so that the fourth partial data CW1d of the first codeword CW1 is loaded into a third location of the new codeword CWb. If a transmission of the selected codeword is completed, the memory controller 120 can select a next codeword and transmit the selected codeword.

The memory controller 120 may perform a DMA operation so that partial data of the selected codeword is sequentially transmitted to the nonvolatile memory 110. For example, in the example described with reference to FIG. 16, the memory controller 120 can program a DMA controller so that the first partial data CW1a of the first codeword CW1 is loaded into a first location of the new codeword CWa. The memory controller 120 can program a DMA controller so that the first partial data CW2a of the second codeword CW2 is loaded into a second location of the new codeword CWa. The memory controller 120 can program a DMA controller so that the second partial data CW1b of the first codeword CW1 is loaded into a third location of the new codeword CWa. The memory controller 120 can program a DMA controller so that the second partial data CW2b of the second codeword CW is loaded into a fourth location of the new codeword CWa.

If a transmission of codewords to be programmed is completed, in a step S860, the memory controller 120 can instruct the nonvolatile memory 110 to begin a program.

That is, the memory controller 120 can interleave codewords by mixing and loading partial data of the codewords when loading the codewords into the nonvolatile memory 110.

In a read operation, the memory controller 120 can control a DMA controller so that codewords that belong to at least one interleave unit are read from the nonvolatile memory 110. The memory controller 110 can receive codewords that belong to the interleave unit from the nonvolatile memory 110. The memory controller 120 can output a codeword corresponding to a read request among the received codewords to an external host device. The memory controller 120 can control the DMA controller so that a codeword corresponding to a read request is output from the nonvolatile memory 110.

Figure 20:
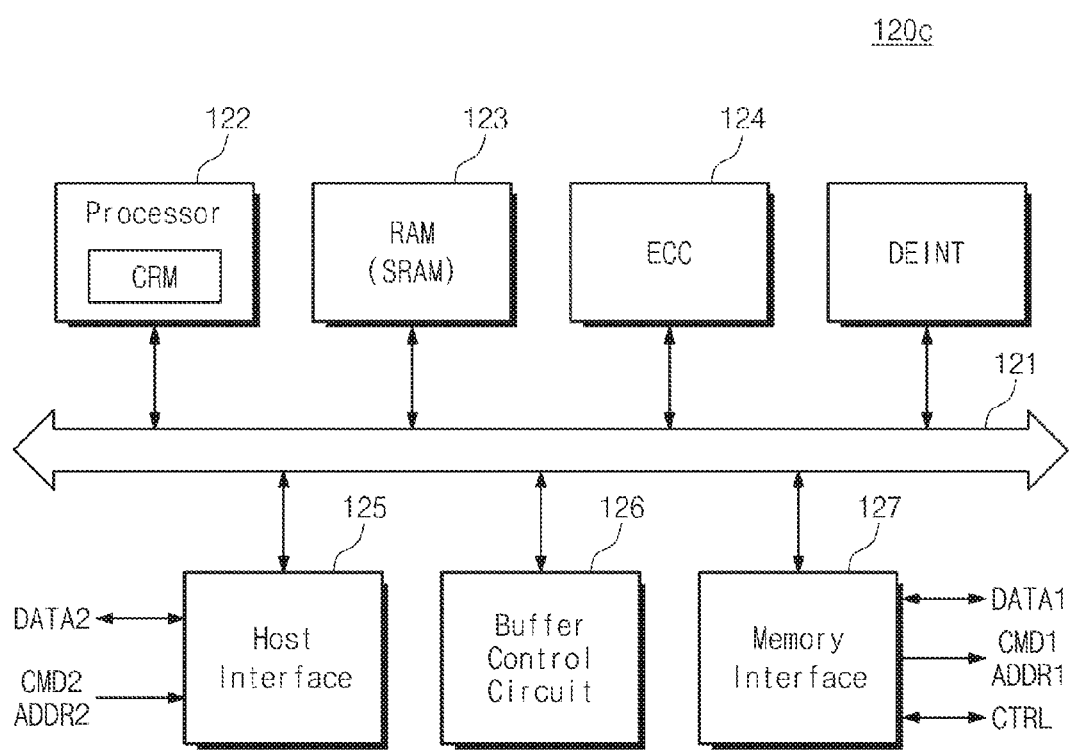
FIG. 20 is a block diagram illustrating a memory controller in accordance with a third embodiment of the inventive concept.

FIG. 20 is a block diagram illustrating a memory controller 120c in accordance with a third embodiment of the inventive concept. Referring to FIGS. 1, 3, 4 and 20, the memory controller 120c includes a bus 121, a processor 122, a RAM 123, an ECC (error correction code) block 124, a host interface 125, a buffer control circuit 126, a memory interface 127 and a de-interleaver DEINT. The memory controller 120c further includes the de-interleaver DEINT compared with the memory controller 120a.

The memory controller 120c can read codewords corresponding to at least one interleave unit from the nonvolatile memory 110. Codewords of at least one interleave unit being received through the memory interface 127 are transmitted to the de-interleaver DEINT. The de-interleaver DEINT can de-interleave the received codewords. The ECC (error correction code) block 124 can perform an error correction decoding with respect to the de-interleaved codewords. That is, a de-interleave and an error correction decoding may be sequentially performed with respect to codewords read from the nonvolatile memory 110. The de-interleaver DEINT performing a de-interleave operation may be provided as separate hardware.

Figure 21:
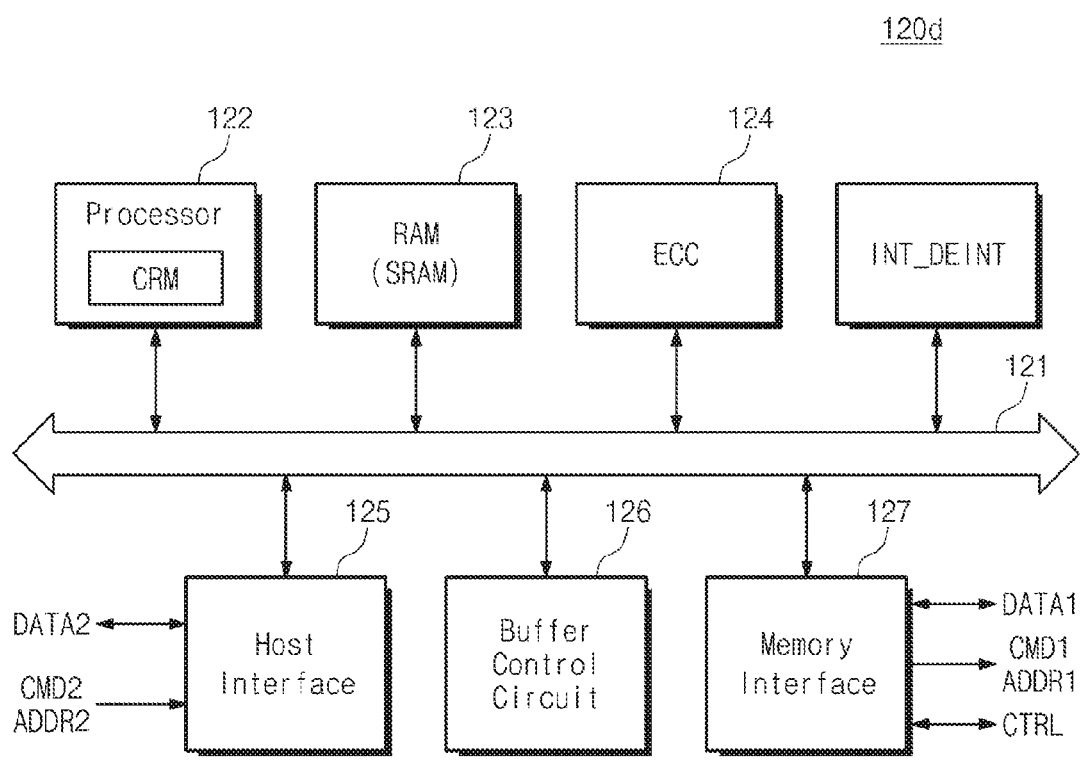
FIG. 21 is a block diagram illustrating a memory controller in accordance with a fourth embodiment of the inventive concept.

FIG. 21 is a block diagram illustrating a memory controller 120d in accordance with a fourth embodiment of the inventive concept. Referring to FIGS. 1, 3, 4 and 21, the memory controller 120d includes a bus 121, a processor 122, a RAM 123, an ECC (error correction code) block 124, a host interface 125, a buffer control circuit 126, a memory interface 127 and an interleaver & de-interleaver INT_DEINT. The memory controller 120d further includes the interleaver & de-interleaver INT_DEINT compared with the memory controller 120a.

The memory controller 120d, when codewords corresponding to at least one interleave unit are collected, can perform an error correction encoding with respect to the collected codewords. The interleaver & de-interleaver INT_DEINT can interleave the error-correction encoded codewords. The interleaved codewords may be transmitted to the nonvolatile memory 110 to be programmed.

When at least one codeword is received, the memory controller 120d can perform an error correction encoding with respect to the received codeword. When error-correction encoded codewords corresponding to at least one interleave unit are collected, the interleaver & de-interleaver INT_DEINT can interleave the error-correction encoded codewords. The interleaved codewords may be transmitted to the nonvolatile memory 110 to be programmed.

The memory controller 120d can read codewords corresponding to at least one interleave unit from the nonvolatile memory 110. Codewords of at least one interleave unit being received through the memory interface 127 are transmitted to the interleaver & de-interleaver INT_DEINT. The interleaver & de-interleaver INT_DEINT can de-interleave the received codewords. The ECC (error correction code) block 124 can perform an error correction decoding with respect to the de-interleaved codewords.

An interleave operation and an error correction encoding may be sequentially performed with respect to codewords to be programmed in the nonvolatile memory 110. A de-interleave operation and an error correction encoding may be sequentially performed with respect to codewords read from the nonvolatile memory 110. The interleaver & de-interleaver INT_DEINT performing interleave and de-interleave operations may be provided as a separate hardware.

Figure 22:
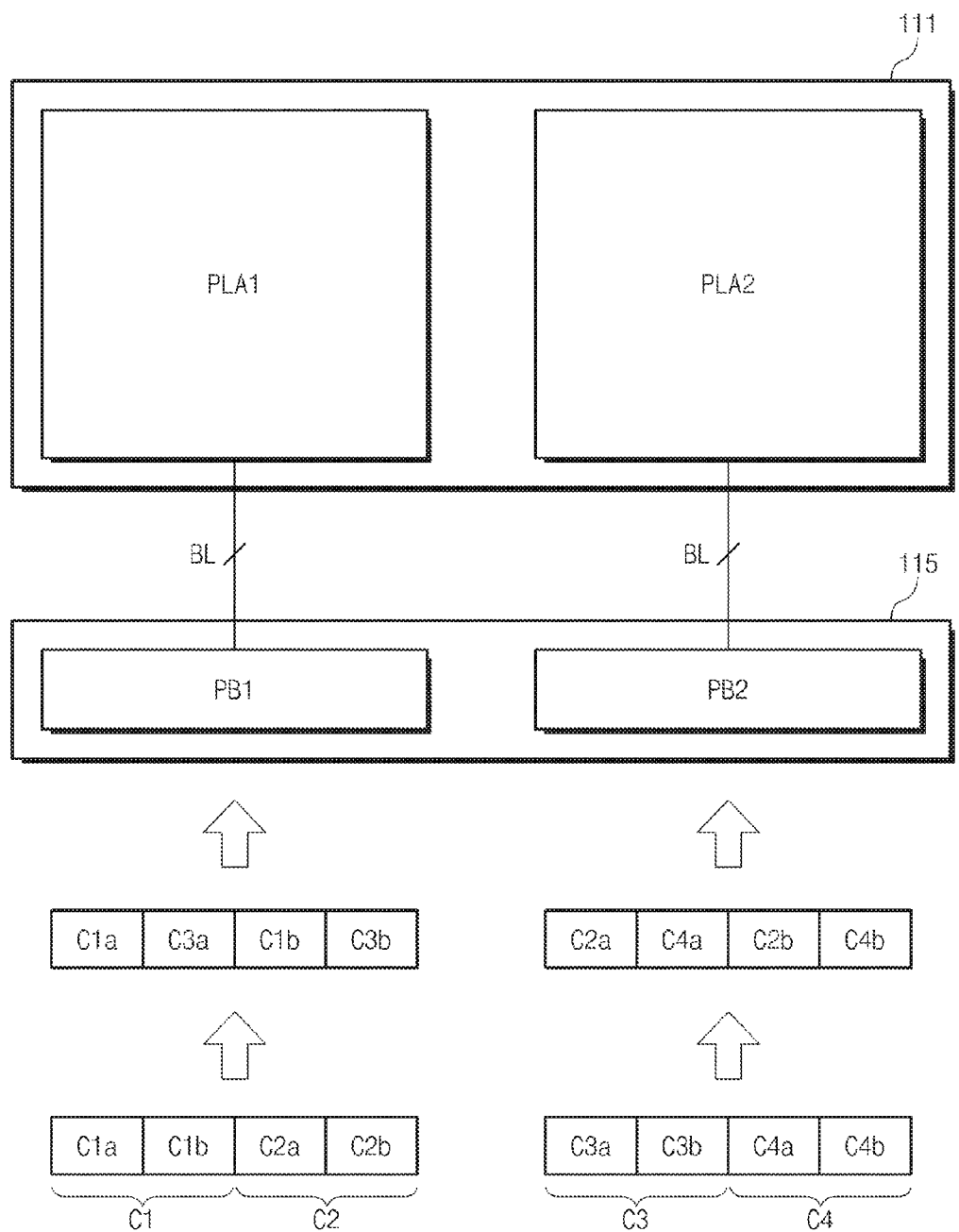
FIG. 22 illustrates an example in which interleaved codewords are programmed in a nonvolatile memory.

FIG. 22 illustrates an example in which interleaved codewords are programmed in a nonvolatile memory. Referring to FIGS. 1, 3, 4 and 22, the memory cell array 111 may include first and second array planes PLA1 and PLA2. Each of the first and second array planes PLA1 and PLA2 includes a plurality of memory blocks BLK. The page buffer circuit 115 includes first and second page buffers PB1 and PB2. The first page buffer PB1 is connected to the first array plane PLA1 through bit lines BL. The first page buffer PB1 can perform read and program operations with respect to the first array plane PLA1. The second page buffer PB2 is connected to the second array plane PLA2 through bit lines BL. The second page buffer PB2 can perform read and program operations with respect to the second array plane PLA2.

The memory controller 120 can perform a multi-plane program using the first and second array planes PLA1 and PLA2. The memory controller 120 can interleave first and second codewords C1 and C2 to be programmed in the first array plane PLA1 and third and fourth codewords C3 and C4 to be programmed in the second array plane PLA2 with one another.

For example, partial data C1a and C1b of the first codeword C1 and partial data C3a and C3b of the third codeword C3 may be programmed in the first array plane PLA1. Partial data C2a and C2b of the second codeword C2 and partial data C4a and C4b of the fourth codeword C4 may be programmed in the second array plane PLA2.

Figure 23:
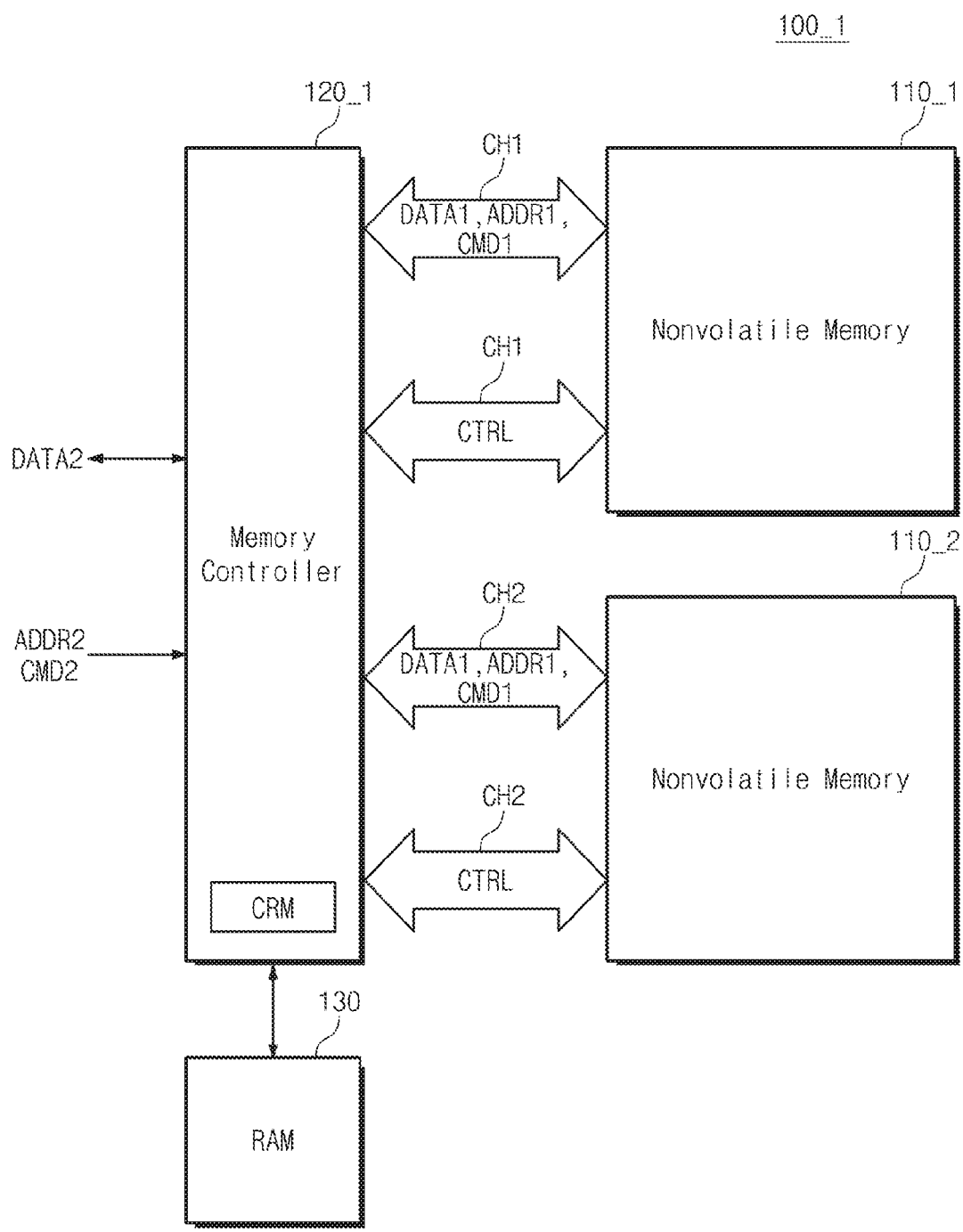
FIG. 23 is a block diagram illustrating a storage device in accordance with other exemplary embodiments of the inventive concept.

FIG. 23 is a block diagram illustrating a storage device 100_1 in accordance with other exemplary embodiments of the inventive concept. Referring to FIG. 23, the storage device 100_1 includes nonvolatile memories 110_1 and 110_2, a memory controller 120_1 and a RAM 130.

In comparison with the storage device 100 of FIG. 1, the memory controller 120_1 is configured to communicate with the nonvolatile memories 110_1 and 110_2 through independent channels. The memory controller 120_1 can communicate with the nonvolatile memories 110_1 and 110_2 through first and second channels CH1 and CH2.

Figure 24:
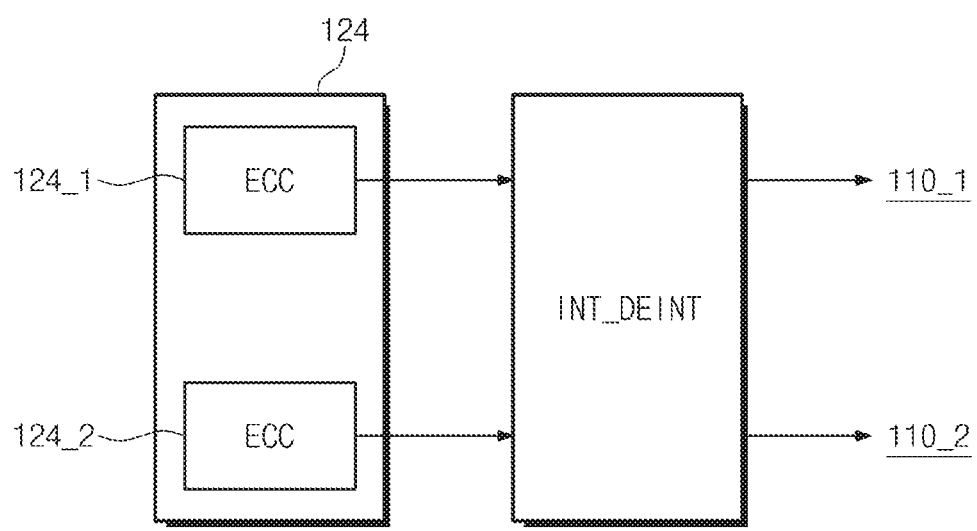
FIG. 24 is a block diagram illustrating an error correction block and an interleaver & de-interleaver of a memory controller of the storage device of FIG. 23.

FIG. 24 is a block diagram illustrating an ECC (error correction code) block 124 and an interleaver & de-interleaver INT_DEINT of a memory controller 120_1 of the storage device 100_1 of FIG. 23. Referring to FIGS. 23 and 24, the ECC (error correction code) block 124 includes error correction circuits 124_1 and 124_2 corresponding to the number of the channels CH1 and CH2 communicating with the nonvolatile memories 110_1 and 110_2. The error correction circuits 124_1 and 124_2 can perform an error correction encoding and decoding independently of each other.

The interleaver & de-interleaver INT_DEINT can receive error-correction encoded codewords from the error correction circuits 124_1 and 124_2. If an encoded codeword is received from one of the error correction circuits 124_1 and 124_2, the interleaver & de-interleaver INT_DEINT can store the encoded codeword. When an encoded codeword is received from the other of the error correction circuits 124_1 and 124_2, the interleaver & de-interleaver INT_DEINT can interleave a stored codeword and a codeword being received. The interleaved codeword may be output to one of the nonvolatile memories 110_1 and 110_2.

According to exemplary embodiments of the inventive concept, a read scheme is adjusted depending on which data is read among data stored in a logical page. Thus, a storage device having improved reliability and an operation method of the storage device are provided.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. An operating method of a storage device including a nonvolatile memory and a memory controller configured to control the nonvolatile memory, the operating method comprising:
   receiving, by the memory controller, a read request from an external device;
   adjusting, by the memory controller, a read scheme of the nonvolatile memory; and
   reading, by the memory controller, target data from the nonvolatile memory according to the adjusted read scheme,
   wherein memory cells corresponding to a wordline and a selection line of the nonvolatile memory device constitute a page, and
   adjusting the read scheme comprises adjusting levels of read voltages according to which a memory cell group among the memory cells of the one page is read.

2. The operating method of claim 1, wherein the read request requests a read of partial data including the target data among data of one logical page among a plurality of logical pages corresponding to the one page.

3. The operating method of claim 1, wherein the memory controller is configured to manage offsets of the read voltages corresponding to memory cell groups of the one page respectively.

4. The operating method of claim 1, further comprising:
   receiving, by the memory controller, a write request with respect to the one page;
   setting, by the memory controller, information of state shaping of a plurality of codewords to be written in memory cell groups of the one page respectively, wherein the information of state shaping includes at least one of a respective number of bits of state shaping parities, ratios of desired states and type of state shaping algorithm;

performing, by the memory controller, a state shaping encoding with respect to the plurality of codewords using the state shaping parities having the respective number of bits differently set; and programming, by the nonvolatile memory, the encoded codewords in the memory cell groups of the one page respectively.

5. The operating method of claim 4, wherein adjusting the read scheme comprises adjusting, by the memory controller, a state shaping decoding scheme with respect to each codeword to be read according to the information of a state shaping.

6. The operating method of claim 4, wherein the information of the state shaping is set according to a location of each memory cell group on the one page in which each codeword is programmed.

7. The operating method of claim 4, wherein the information of the state shaping is set according to a bit error rate of each memory cell group of the one page in which each codeword is programmed.

8. The operating method of claim 1, further comprising:
receiving, by the memory controller, at least first and second codewords;
interleaving, by the memory controller, the first and second codewords to generate interleaved codewords; and
programming, by the nonvolatile memory, the first and second interleaved codewords in the memory cell groups of the one page respectively,
wherein interleaving the first and second codewords comprises:
collecting a first portion of the first codeword and a first portion of the second codeword to generate the first interleaved codeword, and
collecting a second portion of the first codeword and a second portion of the second codeword to generate the second interleaved codeword.

9. The operating method of claim 8, wherein adjusting the read scheme comprises adjusting the first and second interleaved codewords associated with at least one codeword as a read target according to the at least one codeword indicated by the read request.

10. The operating method of claim 8, wherein generating the interleaved codewords comprises loading, by the memory controller, one codeword among the at least two codewords into the nonvolatile memory according to discontinuous addresses.

11. The operating method of claim 8, wherein generating the first and second interleaved codewords comprises alternately loading, by the memory controller, the first portion of the codeword and a first portion of the second codeword into the nonvolatile memory according to continuous addresses.

12. The operating method of claim 8, wherein generating the first and second interleaved codewords comprises generating the first interleaved codeword and second interleaved codeword by interleaving first codewords encoded by a first error correction block and second codewords encoded by a second error correction block,
wherein the first interleaved codeword and the second interleaved codeword are written to the one page of one of a first nonvolatile memory device and a second nonvolatile memory device through one of a first channel and a second channel corresponding to the first error correction block and the second error correction block respectively.

13. A storage device comprising:
a nonvolatile memory configured to store data in logical pages; and
a memory controller configured to control the nonvolatile memory;
wherein the memory controller is configured to adjust a read scheme of the nonvolatile memory,
memory cells corresponding to a wordline and a selection line of the nonvolatile memory device constitute one page, and
the memory controller adjusts a state shaping decoding scheme as the read scheme according to which memory cell group among the memory cells of the one page is read.

14. The storage device of claim 13, wherein the nonvolatile memory comprises a three-dimensional cell array including a plurality of cell strings on a substrate, and wherein each cell string comprises a plurality of charge trap type memory cells and at least one charge trap type select transistor stacked in a direction perpendicular to the substrate.

15. The storage device of claim 13, wherein the memory controller is configured to adjust the read scheme by levels of read voltages as the read scheme according to which memory cell group among the memory cells of the one page is read.

16. The storage device of claim 13, wherein the memory controller is further configured to:
receive a write request with respect to the one page;
set a respective number of bits of state shaping parities of a plurality of codewords to be written in the memory cell groups of the one page respectively;
perform a state shaping encoding with respect to the plurality of codewords using the state shaping parities having the respective number of bits; and
program the encoded codewords in the memory cell groups of the one page respectively.

17. The storage device of claim 16, wherein the memory controller is configured to adjust the state shaping decoding scheme with respect to each codeword according to a number of bits of a state shaping parity of each codeword.

18. The storage device of claim 13, wherein the memory controller is further configured to:
receive at least two codewords;
interleave the received at least two codewords to generate interleaved codewords; and
program the interleaved codewords in the one page.

19. An operating method of a storage device including a nonvolatile memory and a memory controller configured to control the nonvolatile memory, the operating method comprising:
receiving, by the memory controller, a read request from an external device;
adjusting, by the memory controller, a read scheme of the nonvolatile memory; and
reading, by the memory controller, target data from the nonvolatile memory according to the adjusted read scheme,
wherein, the nonvolatile memory comprises a three-dimensional cell array including a plurality of cell strings on a substrate, each cell string comprising a plurality of charge trap type memory cells and at least one charge trap type select transistor stacked in a direction perpendicular to the substrate,
memory cells corresponding to a wordline and a selection line of the nonvolatile memory device constitute one page, and adjusting the read scheme comprises adjusting target memory cell groups to be read according to the target data, the target data having a size corresponding to each memory cell group and distributed among at least two memory cell groups.

* * * * *